(12) United States Patent  
Saiki et al.

(10) Patent No.: US 7,319,066 B2
(45) Date of Patent: Jan. 15, 2008

(54) SEMICONDUCTOR DEVICE AND METHOD FOR FABRICATING THE SAME

(75) Inventors: Takashi Saiki, Kawasaki (JP); Katsuaki Okoshi, Kawasaki (JP); Yuka Hayami, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/973,391

(22) Filed: Oct. 27, 2004

(65) Prior Publication Data

US 2005/0275108 A1 Dec. 15, 2005

(30) Foreign Application Priority Data

Jun. 15, 2004 (JP) .............................. 2004-176755

(51) Int. Cl.
*H01L 29/72* (2006.01)
(52) U.S. Cl. ..................... 438/624; 438/694; 438/761; 438/768; 257/347; 257/758
(58) Field of Classification Search ................ 438/694, 438/761, 768; 257/347, 758
See application file for complete search history.

(56) References Cited

U.S. PATENT DOCUMENTS

| 6,037,634 A | * | 3/2000 | Akiyama ..................... 257/347 |
| 2004/0198067 A1 | * | 10/2004 | Tanabe et al. .............. 438/773 |
| 2004/0227242 A1 | * | 11/2004 | Noguchi et al. ............ 257/751 |

FOREIGN PATENT DOCUMENTS

| JP | 09-064169 (A) | 3/1997 |
| JP | 10-032233 (A) | 2/1998 |

* cited by examiner

*Primary Examiner*—Edward Wojciechowicz
(74) *Attorney, Agent, or Firm*—Westerman, Hattori, Daniels & Adrian, LLP.

(57) ABSTRACT

The semiconductor device comprises a silicon wafer 10, a multilayer interconnection 12 buried in inter-layer insulation film formed on the upper surface of the silicon wafer 10, and a silicon nitride film 16b which is formed on the back surface of the silicon wafer 10 and is an insulation film having a tensile stress, relaxing a stress exerted to the silicon wafer 10 by the inter-layer insulation films in which the multilayer interconnection 12 is buried.

20 Claims, 16 Drawing Sheets

SEMICONDUCTOR DEVICE AND METHOD FOR FABRICATING THE SAME

CROSS-REFERENCE TO RELATED APPLICATION

This application is based upon and claims priority of Japanese Patent Application No. 2004-176755, filed on Jun. 15, 2004, the contents being incorporated herein by reference.

BACKGROUND OF THE INVENTION

The present invention relates to a semiconductor device and a method for fabricating the same, more specifically a semiconductor device and a method for fabricating the same, the device having an insulation film formed on a surface of a semiconductor substrate, which is an inter-layer insulation film or others having tensile stress.

The method for fabricating a conventional semiconductor device having the multilayer interconnection structure formed on a semiconductor substrate will be explained with reference to FIGS. 14A-14C, 15A-15C and 16A-16B. FIGS. 14A-14C, 15A-15C and 16A-16B are sectional views of the semiconductor device having the multilayer interconnection structure in the steps of the method for fabricating the conventional semiconductor device having the multilayer interconnection structure.

First, a silicon oxide films 214a, 214b are formed respectively on the upper surface and the back surface of a silicon wafer 210 by, e.g., thermal oxidation.

Then, a silicon nitride films 216a, 216b are formed by, e.g., thermal CVD using a vertical furnace respectively on the silicon oxide films 214a, 214b formed respectively on the upper surface and the back surface of the silicon wafer 210 (FIG. 14A).

Then, a photoresist film 220 exposing regions for a device isolation film to be formed in and covering the rest region is formed on the silicon nitride film 216a on the upper surface of the silicon wafer 210 by photolithography (FIG. 14B).

Then, with the photoresist film 220 as a mask, the silicon nitride film 216a is etched. Thus, openings 222 are formed in the silicon nitride film 216a (FIG. 14C).

Next, with the photoresist film 220 and the silicon nitride film 216a as a mask, the silicon oxide film 214a and the silicon wafer 210 are respectively etched from the side of the upper surface of the silicon wafer 210. Thus, openings 224 are formed in the silicon oxide film 214a, and grooves 226 are formed in the surface of the silicon wafer 210.

After the grooves 226 are formed in the surface of the silicon wafer 210, the photoresist film 220 is removed by, e.g., ashing (FIG. 15A).

Next, a silicon oxide film 228 is formed on the entire upper surface of the silicon wafer 210 by, e.g., CVD (FIG. 15B).

Next, the silicon oxide film 228 is polished by, e.g., CMP until the upper surface of the silicon nitride film 216a is exposed to remove the silicon oxide film 228 on the silicon nitride film 216a. The silicon oxide film 228 is buried in the grooves 226 formed in the silicon wafer 210, the openings 224 formed in the silicon oxide film 214a and the openings 222 formed in the silicon nitride film 216a. Thus, the device isolation film of the silicon oxide film 228 is formed (FIG. 15C).

Then, the silicon nitride film 216a on the upper surface of the silicon wafer 210 is removed by wet etching. At this time, the silicon nitride film 216b on the back surface of the silicon wafer 210 is also etched off (FIG. 16A).

Next, the silicon oxide film 214a exposed on the upper surface of the silicon wafer 210 is removed by wet etching. At this time, the silicon oxide film 214b on the back surface of the silicon wafer 210 is also etched off (FIG. 16B).

On the upper surface of the silicon wafer 210 having the device region thus defined by the device isolation film 228, semiconductor devices, such as MOS transistors, etc., are formed.

On the upper surface of the silicon wafer 210 with semiconductor devices formed on, interconnection layers buried in inter-layer insulation films by single damascening, dual damascening or others are suitably repeatedly formed to thereby form a multilayer interconnection including a plurality of interconnection layers.

In forming a multilayer interconnection on the upper surface of a semiconductor substrate as of the above-described silicon wafer or others, when the inter-layer insulation films for the interconnection layers to be buried in are formed, the tensile stress of the inter-layer insulation films often causes the semiconductor substrate to warp convexly toward the back surface of the semiconductor substrate.

Recently, as semiconductor devices are required to be highly integrated, the layer number of interconnection layers forming multilayer interconnections formed on semiconductor substrates is increased. As semiconductor devices are required to be speedy, inter-layer insulation films with interconnection layers, etc. buried in are formed of low dielectric constant (low-k) insulation films.

Semiconductor substrates having such increased number of such low-k inter-layer insulation films formed on the surface are often caused to largely warp convexly toward the back surfaces due to the tensile stress of the inter-layer insulation films. Furthermore, diameters of semiconductor substrates used in fabricating semiconductor devices are increasing, which makes the warpage of semiconductor substrates tend to increase.

Here, as means for improving characteristics of the NMOS field effect transistors is known the means in which a silicon nitride film of, e.g., a 30-100 nm-thickness is formed between a semiconductor substrate and an upper layer of an interconnection layer or others formed on the upper surface thereof to thereby introduce strains due to a tensile stress of, e.g., 1-2 GPa of the silicon nitride film into the channel regions. However, the tensile stress of the insulation film formed between the semiconductor substrate and the upper layer, such as the interconnection layer or others formed on the upper surface thereof is a cause for the semiconductor substrate warping convexly toward the back surface thereof.

The warpage of the semiconductor substrate is a cause for the defective suction in the transfer system, in which semiconductor substrates are sucked by chucks, etc. to be transferred. Accordingly, such warpage of semiconductor substrate is required to be suppressed.

The background arts of the present invention are disclosed in e.g., Japanese published unexamined patent application No. Hei 09-64169 (1997) and Japanese published unexamined patent application No. Hei 10-32233 (1998).

SUMMARY OF THE INVENTION

An object of the present invention is to provide a semiconductor device with an insulation film, such as an inter-layer insulation film, etc. having a tensile stress formed on an upper surface of a semiconductor substrate, which can suppress the warpage, and a method for fabricating the semiconductor device.

According to one aspect of the present invention, there is provided a semiconductor device comprising: a substrate of a semiconductor; a gate electrode formed on the substrate with a gate insulation film formed therebetween; a source/drain region formed in the substrate on both sides of the gate electrode; a contact plug electrically connected to the substrate; a first insulation film formed on one surface of the substrate; a multilayer interconnection buried in the first insulation film; and a second insulation film formed on the other surface of the substrate and having a stress relaxing a stress exerted by the first insulation film to the substrate.

According to another aspect of the present invention, there is provided a method for fabricating a semiconductor device comprising the steps of: forming a gate electrode on one surface of a semiconductor substrate with a gate insulation film formed therebetween; forming a source/drain region in the semiconductor substrate on both sides of the gate electrode; forming a contact plug electrically connected to the substrate; forming a first insulation film on said one surface of the semiconductor substrate; and forming a multilayer interconnection buried in the first insulation film; the method further comprising before the step of forming the first insulation film, the step of forming a second insulation film on the other surface of the substrate, having a stress relaxing a stress exerted by the first insulation film to the substrate.

According to the present invention, the semiconductor device comprising a multilayer interconnection buried in insulation films formed on one surface of a semiconductor substrate has an insulation film formed on the other surface of the substrate and having a stress for relaxing a stress exerted by the insulation films formed on one surface of the substrate to the substrate, whereby the warpage of the substrate can be depressed. Thus, the generation of defective suction in the transfer system for semiconductor substrates can be prevented.

Furthermore, according to the present invention, the insulation film which is formed on the other surface of the substrate and has a stress for relaxing a stress exerted to the substrate by insulation films to be formed on one surface of the substrate is formed concurrently with forming an insulation film as a mask for etching and a stopper for polishing in forming a device isolation film, whereby the warpage of the substrate can be depressed without adding to the step number of the method for fabricating the semiconductor device.

DETAILED DESCRIPTION OF THE INVENTION

A First Embodiment

Figure 1:
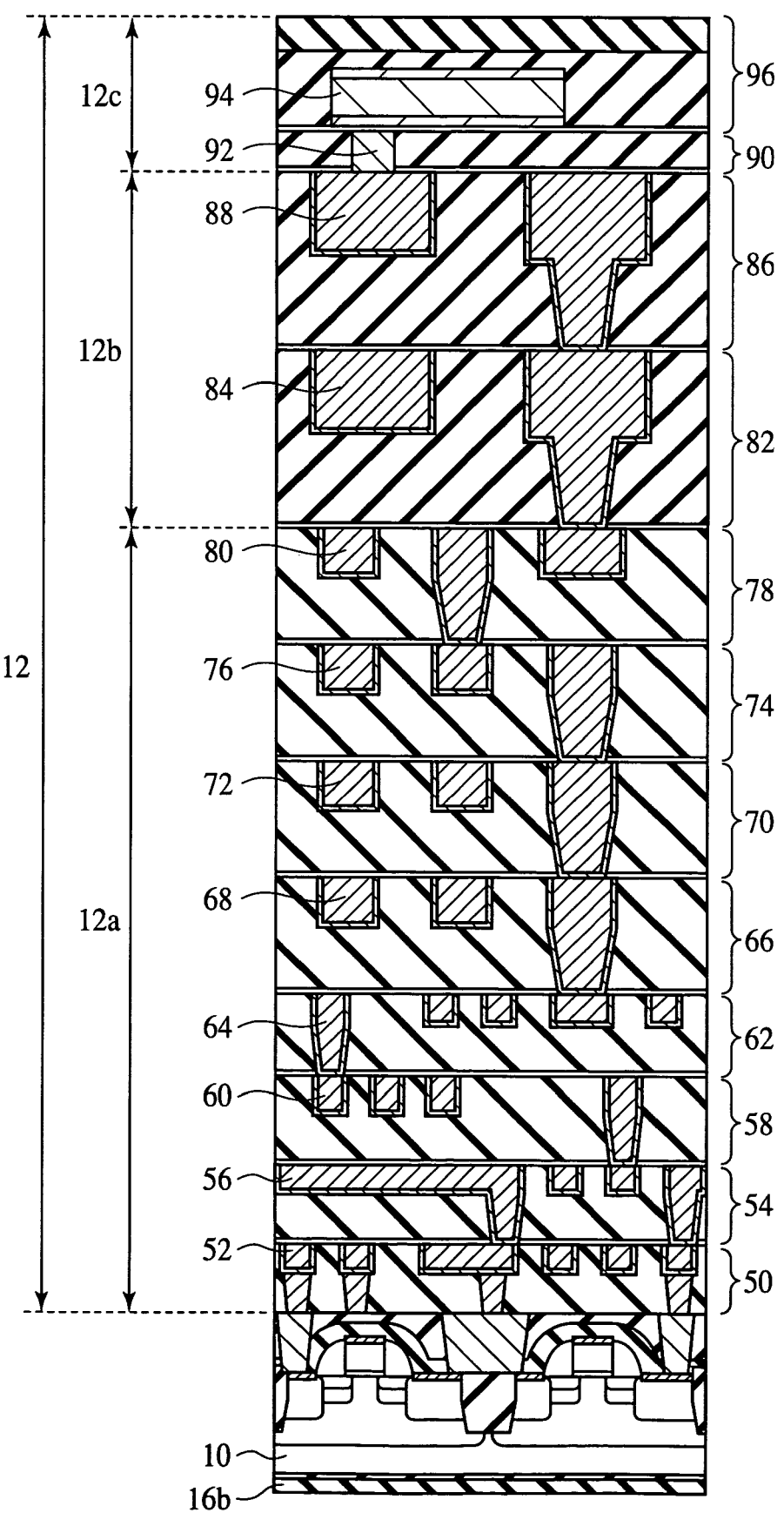
FIG. 1 is a diagrammatic sectional view of the semiconductor device according to a first embodiment of the present invention, which illustrates a structure thereof (Part 1).
Figure 2:
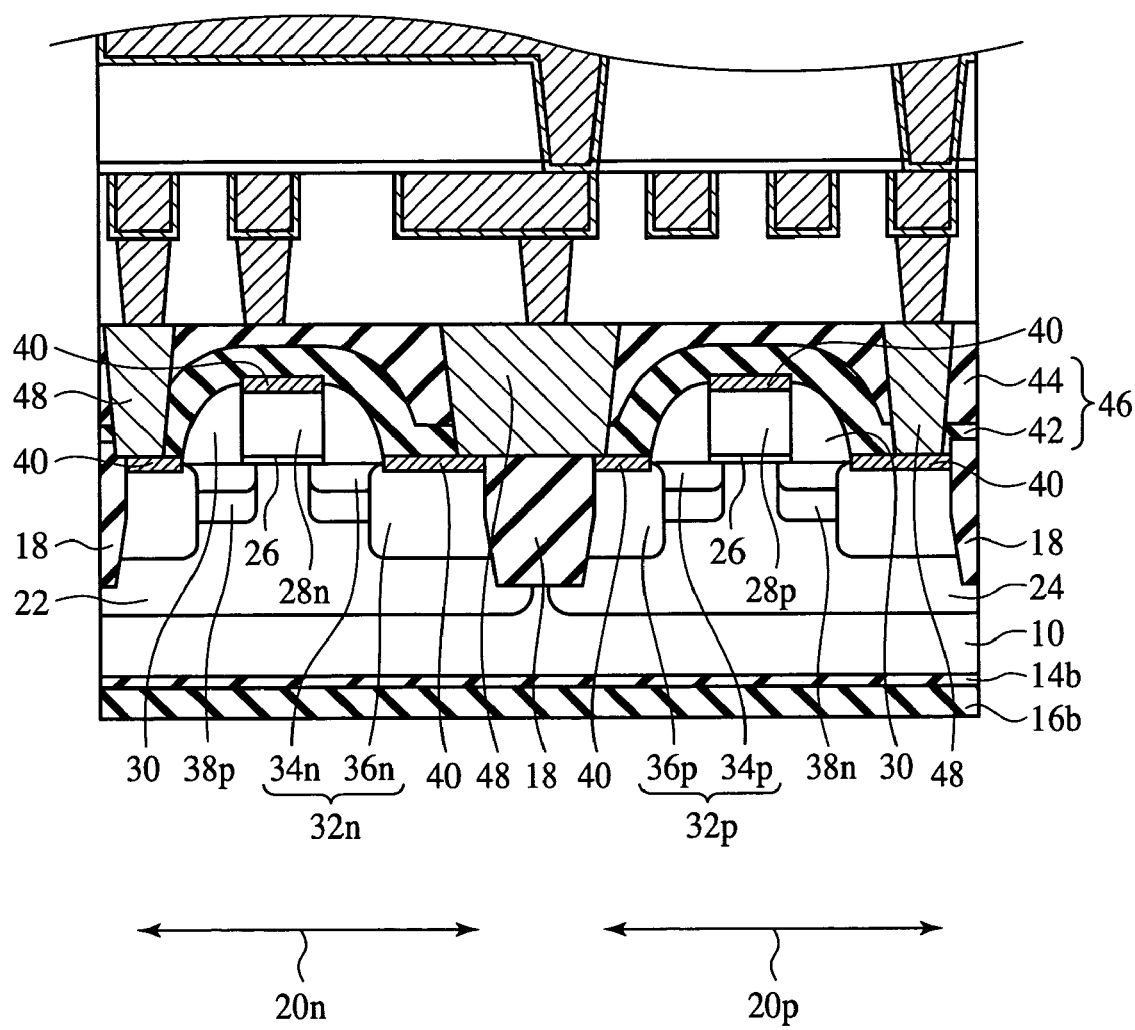
FIG. 2 is a diagrammatic sectional view of the semiconductor device according to the first embodiment of the present invention, which illustrates the structure thereof (Part 2).
Figure 3A:
FIGS. 3A-3C are views explaining a warped state of the semiconductor device according to the first embodiment of the present invention.
Figure 3B:
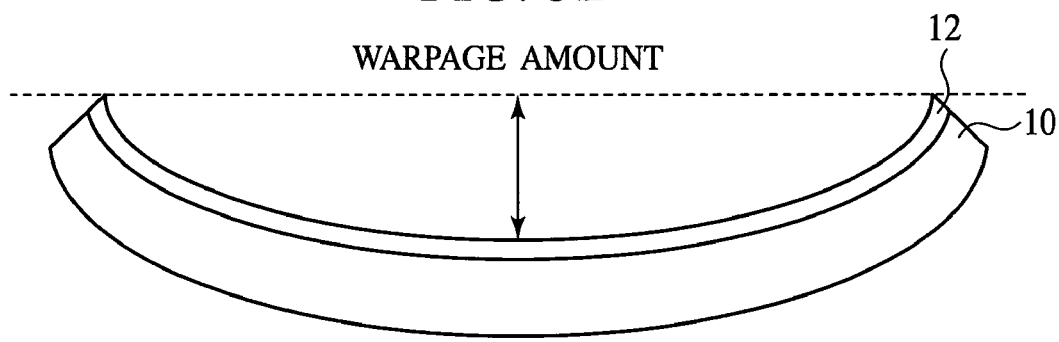
Figure 3C:
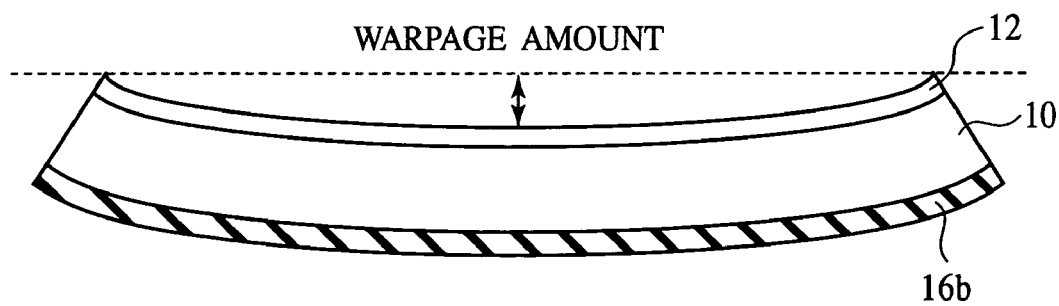
Figure 4:
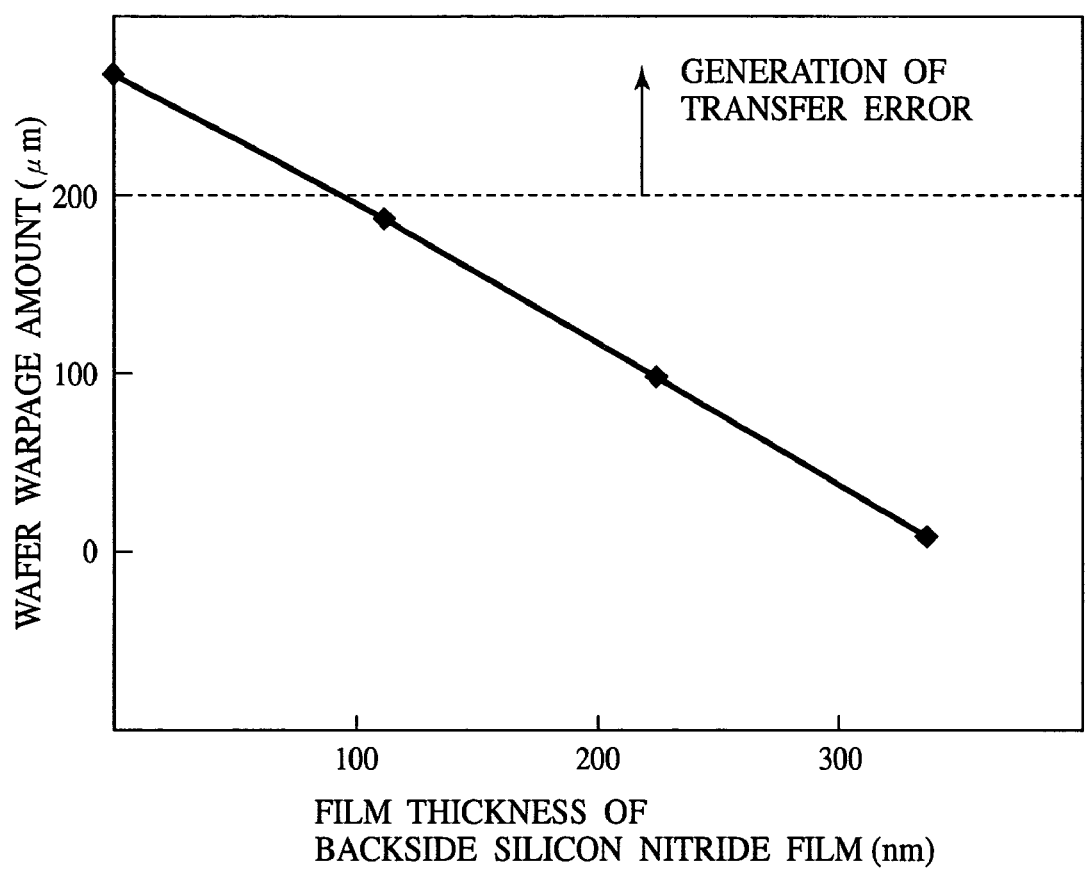
FIG. 4 is a graph of relationships between warpage amounts of a silicon wafer with a multilayer interconnection formed on the upper surface, and the film thickness of a silicon nitride film formed on the back surface of the silicon wafer.

The semiconductor device and the method for fabricating the same according to a first embodiment of the present invention will be explained with reference to FIGS. 1, 2, 3A-3C, 4, 5A-5C, 6A-6C, 7A-7C, 8A-8C and 9A-9C. FIGS. 1 and 2 are diagrammatic sectional views of the semiconductor device according to the present embodiment. FIGS. 3A-3C are views explaining the warpage of the semiconductor device according to the present embodiment. FIG. 4 is a graph of relationships between warpage amounts of a silicon wafer with a multilayer interconnection formed on the upper surface, and the film thickness of a silicon nitride film formed on the back surface of the silicon wafer. FIGS. 5A-5C, 6A-6C, 7A-7C, 8A-8C and 9A-9C are sectional view of the semiconductor device according to the present embodiment in the steps of the method for fabricating the same, which illustrate the method.

First, the structure of the semiconductor device according to the present embodiment will be explained with reference to FIGS. 1 and 2. FIG. 1 is a diagrammatic sectional view of the semiconductor device according to the present embodiment, which illustrates a general structure thereof. FIG. 2 is a diagrammatic sectional view of the semiconductor device according to the present embodiment, which illustrates the structure near the silicon wafer.

As illustrated in FIG. 1, the semiconductor device according to the present embodiment includes a silicon wafer 10 having an NMOS transistor and a PMOS transistor formed on the upper surface, and a multilayer interconnection 12 formed on the upper surface of the silicon wafer 10.

As illustrated in FIG. 2, a silicon nitride film 16b is formed on the back surface of the silicon wafer 10 with a silicon oxide film 14b formed therebetween. The silicon nitride film 16b is an insulation film having a tensile stress.

A device isolation film 18 for defining device regions is formed on the upper surface of the silicon wafer 10. On the upper surface of the silicon wafer 10, the device isolation film 18 defines an NMOS transistor region 20n with the NMOS transistor formed in and a PMOS transistor region 20p with the PMOS transistor formed in.

A p type well 22 is formed in the silicon wafer 10 in the NMOS transistor region 20n an n type well 24 is formed in the silicon wafer 10 in the PMOS transistor region 20p.

On the upper surface of the silicon wafer 10 in the NMOS transistor region 20n, a gate electrode 28n is formed with a gate insulation film 26 formed therebetween. A sidewall insulation film 30 is formed on the side wall of the gate electrode 28n. In the silicon wafer 10 on both sides of the gate electrode 28n, n type source/drain diffused layers 32n are formed. The source/drain diffused layers 32n includes a shallow lightly doped impurity diffused region 34n having the end nearer to the gate electrode 28n extended up to below the sidewall insulation film 30, and a deep heavily doped impurity diffused region 36n having the end nearer to the gate electrode 28n extended up to the end of the sidewall insulation film 30. P type pocket regions 38p are formed on the side of the source/drain diffused layers 32n nearer to the channel region. Metal silicide films 40 are formed respectively on the gate electrode 28n and the source/drain diffused layers 32n. Thus, the NMOS transistor including the gate electrode 28n and the source/drain diffused layers 32n is formed.

On the upper surface of the silicon wafer 10 in the PMOS transistor region 20p, a gate electrode 28p is formed with the gate insulation film 26 formed therebetween. The sidewall insulation film 30 is formed on the side wall of the gate electrode 28p. In the silicon wafer 10 on both sides of the gate electrode 28p, type source/drain diffused layers 32p are formed. The source/drain diffused layers 32p includes a lightly doped impurity diffused region 34p having the end nearer to the gate electrode 28p extended up to below the sidewall insulation film 30 and a heavily doped impurity diffused region 36p having the side nearer to the gate electrode 28p extended up to the end of the sidewall insulation film 30. N type pockets regions 38n are formed the side of the source/drain diffused layers 32p nearer to the channel region. Metal silicide films 40 are formed respectively on the gate electrode 28p and the source/drain diffused layer 32p. Thus, the PMOS transistor including the gate electrode 28p and the source/drain diffused layer 32p is formed.

On the silicon wafer 10 with the NMOS transistor and PMOS transistor formed on, inter-layer insulation film 46 of a silicon nitride film 42 and a silicon oxide film 44 formed the latter on the former is formed. Contact plugs 48 electrically connected to the source/drain diffused layers 32n, 32p are buried in the inter-layer insulation film 46.

On the inter-layer insulation film 46 with contact plugs 48 buried in, as illustrated in FIG. 1, a multilayer interconnection 12 including 11 interconnection layers is formed. The multilayer interconnection 12 is constituted with a first metal interconnection part 12a including 8 interconnection layers, a second metal interconnection part 12b including 2 interconnection layers, and a third metal interconnection part 12c including 1 interconnection layer.

In the first metal interconnection part 12a, an inter-layer insulation film 50 of a low-k insulation film is formed on the inter-layer insulation film 46 with the contact plugs 48 buried in. An interconnection layer 52 is buried in the inter-layer insulation film 50. On the inter-layer insulation film 50, inter-layer insulation films 54, 58, 62, 66, 70, 74, 78 each formed of a stopper film of, e.g., SiC film and a low-k insulation film of, e.g., SIOC film formed the latter on the former are formed sequentially the latter on the former. Interconnection layers 56, 60, 64, 68, 72, 76, 80 are buried respectively in the inter-layer insulation films 54, 58, 62, 66, 70, 74, 78.

In the second metal interconnection part 12b, an inter-layer insulation film 82 formed of an SiC film and a silicon oxide film formed the latter on the former is formed on the inter-layer insulation film 78 with the interconnection layer 80 buried in. An interconnection layer 84 is buried in the inter-layer insulation film 82. On the inter-layer insulation film 82, an inter-layer insulation film 86 of the same layer structure as the inter-layer insulation film 82 is formed. An interconnection layer 88 is buried in the inter-layer insulation film 86.

In the third metal interconnection part 12c, an inter-layer insulation film 90 formed of an SiC film and a silicon oxide film formed the latter on the former is formed on the inter-layer insulation film 86 with the interconnection layer 88 buried in. A contact plug 92 is buried in the inter-layer insulation film 90. On the inter-layer insulation film 90, an interconnection layer 94 is formed, electrically connected to the contact plug 92. On the inter-layer insulation film 90 with the interconnection layer 90 formed on, a cover film 92 formed of a silicon oxide film and a silicon nitride film formed the latter on the former is formed.

Thus, the semiconductor device according to the present embodiment is constituted.

The semiconductor device according to the present embodiment is characterized mainly in that the silicon nitride film 16b which is an insulation film having a tensile stress is formed on the back surface of the silicon wafer 10 with the insulation films, such as the inter-layer insulation films of silicon nitride film, etc., having tensile stresses formed on the upper surface.

The silicon wafer 10 without anything formed on the upper surface and the back surface thereof has substantially no warpage as illustrated in FIG. 3A.

The silicon wafer 10 having the multilayer interconnection 12 formed on the upper surface and having the back surface exposed is warped convexly toward the back surface as illustrated in FIG. 3B due to the tensile stresses of the inter-layer insulation films with the interconnection layer buried in, the cover film, etc. The insulation films which cause such warpage of the silicon wafer 10 are, silicon nitride film of, e.g., a 1-2 GPa tensile stress and inter-layer insulation films of low-k insulation film with interconnection layers of copper, etc. buried in. When the stopper film, which functions as the stopper for etching or polishing and the cover film or others formed on the multilayer interconnection are formed of silicon nitride film or others having tensile stresses, such insulation films also causes the warpage of the silicon wafer 10. The tensile stress of the low-k insulation film itself is not high. However, when an interconnection layer of copper or others is buried in a low-k insulation film, the low-k insulation film has the tensile stress due to the compression stress of the interconnection layer, which is a cause for the warpage of the silicon wafer 10. When the silicon wafer 10 has a large warpage amount, defective suction takes place in the transfer system, in which the silicon wafer 10 is sucked with chuck, etc. to be transferred.

The semiconductor device according to the present embodiment has the silicon nitride film 16b, which is an insulation film having a tensile stress, formed on the back surface of the silicon wafer 10. When the multilayer interconnection 12 is formed on the upper surface of the silicon wafer 10, and the insulation films having tensile stresses, such as silicon nitride film, low-k insulation films with the interconnection layers of copper or others buried in, etc., the silicon nitride film 16b relaxes the stress to be exerted to the silicon wafer 10. Thus, the semiconductor device according to the present embodiment can depress the warpage of the silicon wafer 10 as illustrated in FIG. 3C in comparison with the warpage of the silicon wafer 10 with the back surface exposed as illustrated in FIG. 3B. Thus, the warpage of the silicon wafer 10 is depressed, whereby the defective suction can be prevented in the transfer system, in which the silicon wafer 10 is sucked with chucks, etc. to be transferred.

The silicon nitride film 16b is formed concurrently with forming a silicon nitride film 16a which is used as the mask for etching and the stopper for polishing in forming the device isolation film 18 defining the device regions. Thus, the formation of the silicon nitride film 16b does not add to the number of the steps of the method for fabricating the semiconductor device.

The film thickness of the silicon nitride film 16b to be formed on the back surface of the silicon wafer 10 is set in accordance with the tensile stress of the inter-layer insulation films to be formed on the upper surface of the silicon wafer 10. That is, the film thickness of the silicon nitride film 16b is set so that the tensile stress of the inter-layer insulation films of the multilayer interconnection 12, and the tensile stress of the silicon nitride film 16b are substantially equal to each other. Specifically, the tensile stress of the silicon nitride film 16b is set at, e.g., 1-2 GPa.

FIG. 4 is a graph of the warpage amounts of the silicon wafer with the multilayer interconnection formed on the upper surface, which were measured with the film thickness of the silicon nitride film formed on the back surface changed. The film thicknesses of the silicon nitride film formed on the back surface of the silicon wafer are taken on the horizontal axis of the graph, and on the vertical axis, the warpage amounts of the silicon wafer are taken. In the transfer system used by the inventors, et al. of the present application, when the warpage amounts of the silicon wafer is above 200 μm including 200 μm, transfer errors due to defective suction took place.

As evident in the graph, the film thickness of the silicon nitride film to be formed on the back surface of the silicon wafer is, e.g., 100 nm or more, the warpage amount of the silicon wafer can be depressed to a value of below 200 μm excluding 200 μm which prevents the generation of the transfer error.

Next, the method for fabricating the semiconductor device according to the present embodiment will be explained with reference to FIG. 1 and FIGS. 5A-5C, 6A-6C, 7A-7C, 8A-8C and 9A-9C.

First, the silicon oxide films 14a, 14b of, e.g., a 5-10 nm-thickness are formed respectively on the upper surface and the back surface of the silicon wafer 10 by, e.g., thermal oxidation. The silicon wafer 10 has, e.g., a 20 mm-diameter. The upper surface of the silicon wafer 10 is the surface where devices are to be formed, while the back surface of the silicon wafer 10 is the surface where no device is to be formed.

Figure 5A:
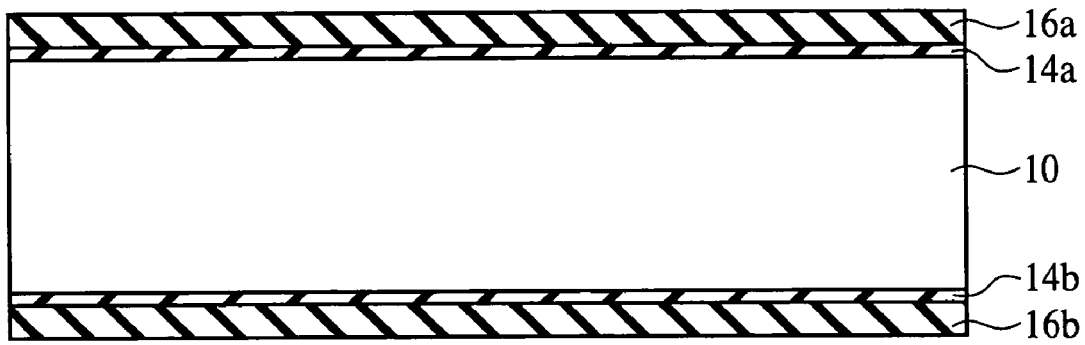
FIGS. 5A-5C are sectional views of the semiconductor device according to the first embodiment of the present invention in the steps of the method for fabricating the same, which illustrate the method (Part 1).

Next, on the silicon oxide film 14a, 14b formed on the upper surface and the back surface of the silicon wafer 10, the silicon nitride films 16a, 16b of, e.g., a 100-200 nm-thickness are formed by thermal CVD using, e.g., a vertical furnace (FIG. 5A). As conditions for forming the silicon nitride films 16a, 16b, the raw material gas is a mixed gas of, e.g., $SiH_2Cl_2$ and $NH_3$, and the film forming temperature is, e.g., 700-800° C. By using a vertical furnace in forming the films, the silicon nitride film 16a which functions as a mask for etching and a stopper for polishing and the silicon nitride film 16b can be formed respectively on the upper surface of the silicon wafer 10 and on the back surface of the silicon wafer 10.

Figure 5B:
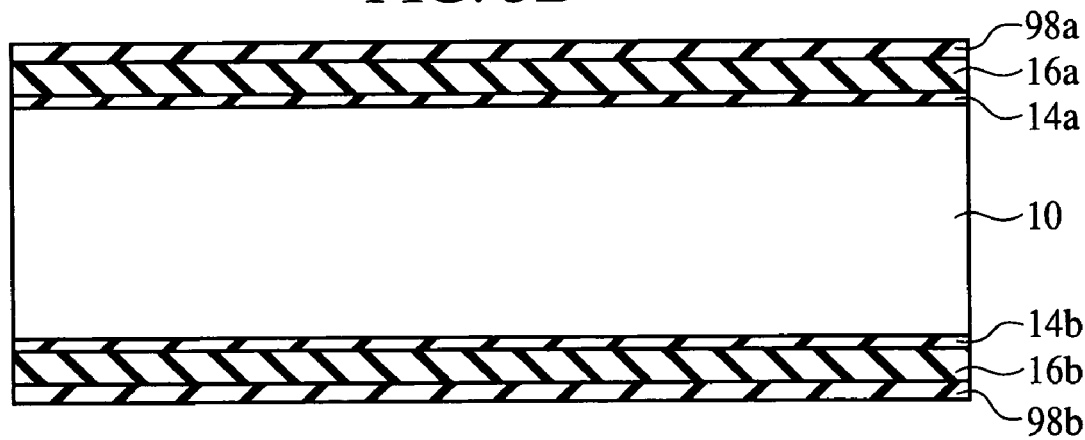

Then, the silicon oxide films 98a, 98b of, e.g., a 100-200 nm-thickness are formed by, e.g., thermal CVD using a vertical furnace on the silicon nitride film 16a, 16b formed on the upper surface and the back surface of the silicon wafer 10 (FIG. 5B). As conditions for forming the silicon oxide films 98a, 98b, the raw material gas is a mixed gas of, e.g., TEOS (tetraethoxysilane) and $O_2$, and the film forming temperature is, e.g., 600-700° C. As will be described later, the silicon oxide film 98b functions as a protection film which covers the silicon nitride film 16b so that the silicon nitride film 16b is not removed by the etching for removing the silicon nitride film 16a.

Figure 5C:
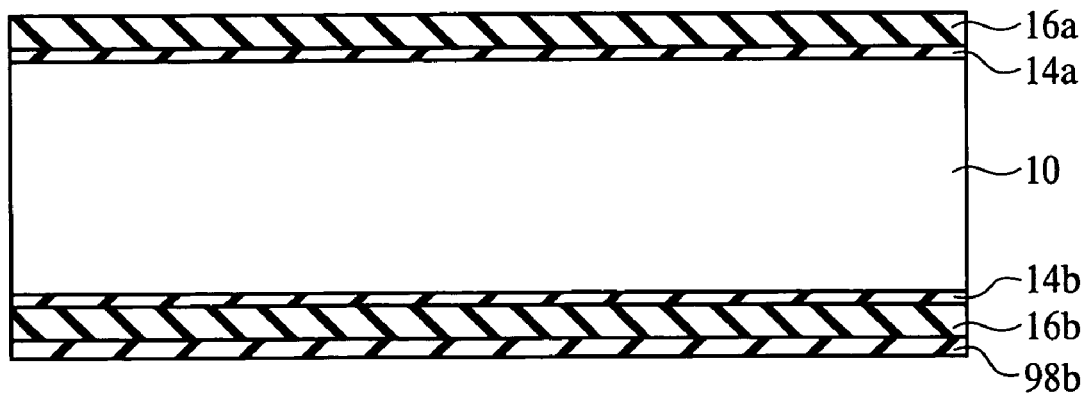

Then, of the silicon oxide films 98a, 98b, the silicon oxide film 98a formed on the upper surface of the silicon wafer 10 is selectively removed by wet etching using, e.g., hydrofluoric acid (FIG. 5C). The silicon oxide film 98a on the upper surface of the silicon wafer 10 can be selectively removed by wet etching using, e.g., a single wafer spin cleaner.

Figure 6A:
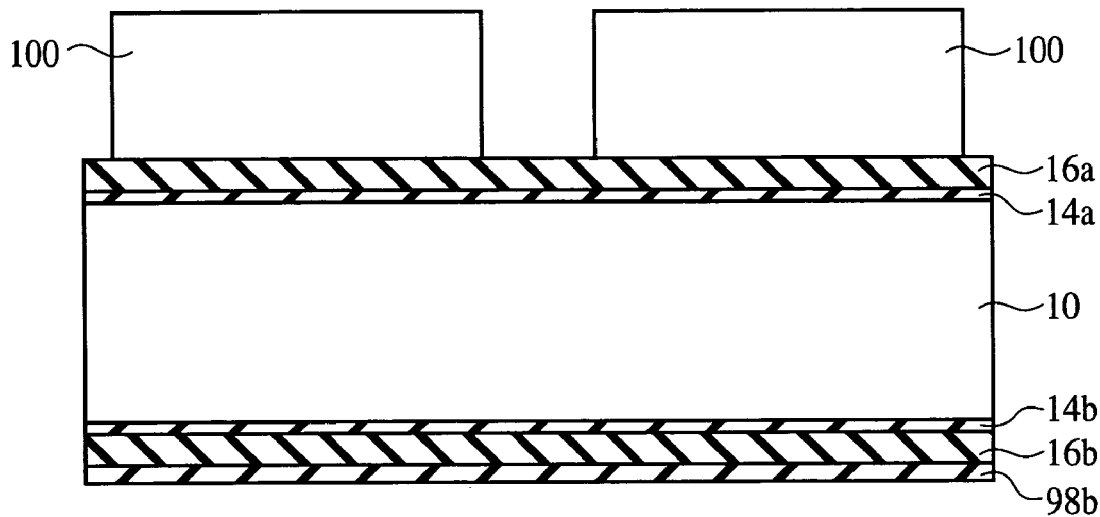
FIGS. 6A-6C are sectional views of the semiconductor device according to the first embodiment of the present invention in the steps of the method for fabricating the same, which illustrate the method (Part 2).

Next, a photoresist film 100 for exposing regions for the device isolation films 18 to be formed in and covering the rest region is formed by photolithography on the silicon nitride film 16a on the upper surface of the silicon wafer 10 (FIG. 6A).

Figure 6B:
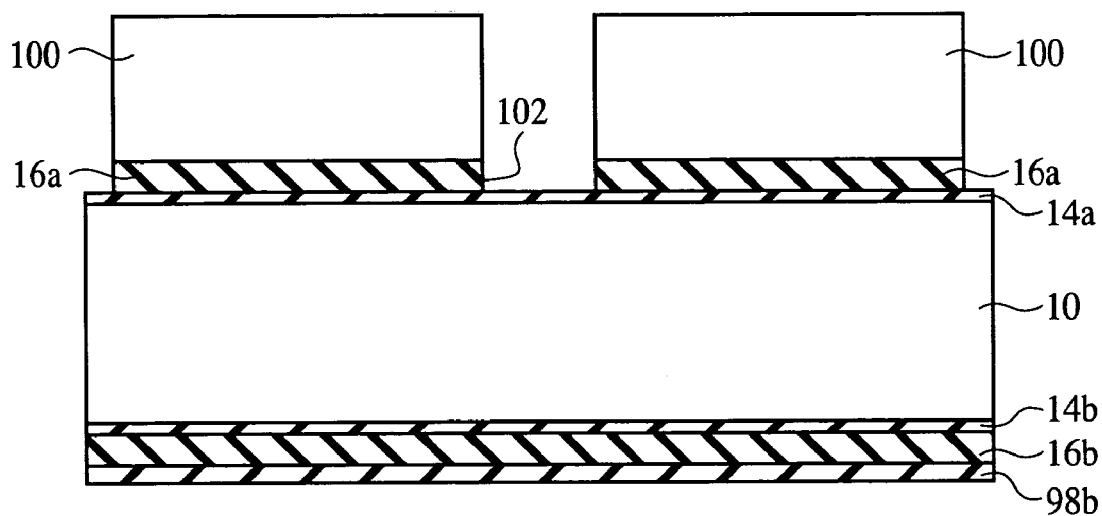

Then, with the photoresist film 100 as a mask, the silicon nitride film 16a is etched. Thus, openings 102 are formed in the silicon nitride film 16a (FIG. 6B).

Then, with the photoresist film 100 and the silicon nitride film 16a as a mask, the silicon oxide film 14a and the silicon wafer 10 are respectively etched from the side of the upper surface of the silicon wafer 10 openings 104 are formed in the silicon oxide film 14a while trenches 106 of, e.g., a 0.3-0.5 μm-depth are formed in the upper surface of the silicon wafer 10.

Figure 6C:
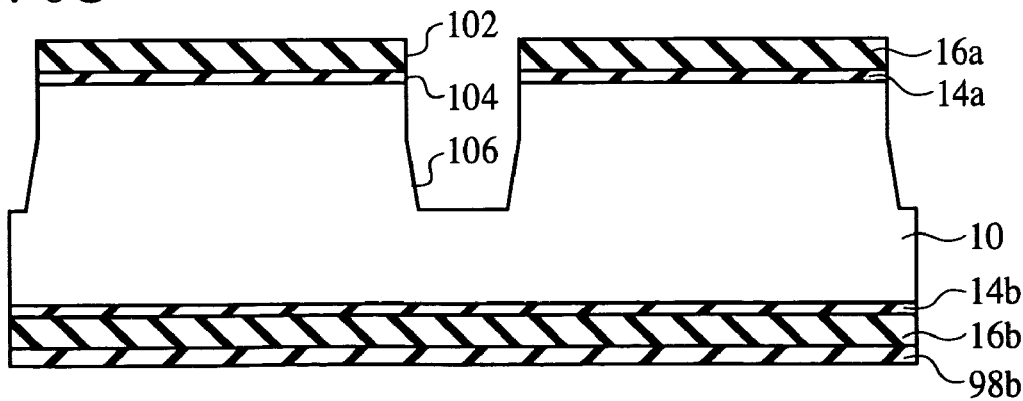

After the trenches 106 have been formed in the surface of the silicon wafer 10, the photoresist film 100 is removed by, e.g., ashing (FIG. 6C).

Figure 7A:
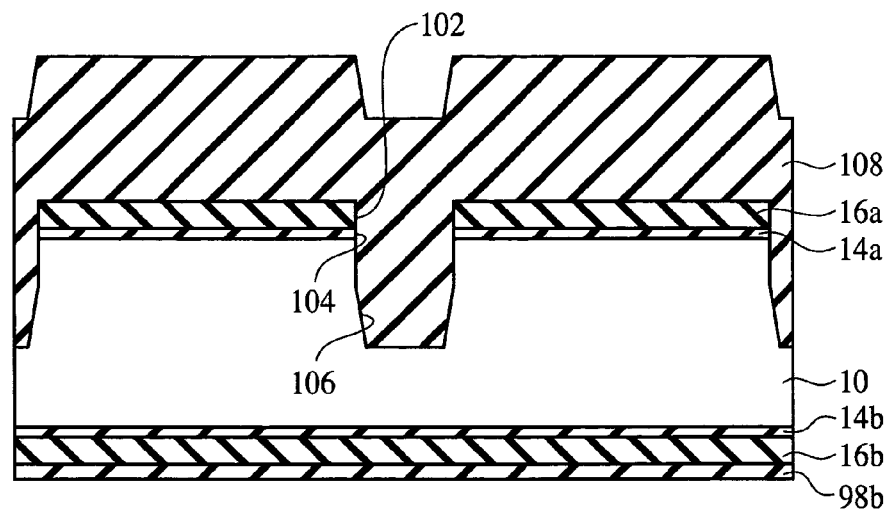
FIGS. 7A-7C are sectional views of the semiconductor device according to the first embodiment of the present invention in the steps of the method for fabricating the same, which illustrate the method (Part 3).

Then, the silicon oxide film 108 is formed in, e.g., a 400-600 nm-thickness on the entire upper surface of the silicon wafer 10 by, e.g., CVD (FIG. 7A).

Figure 7B:
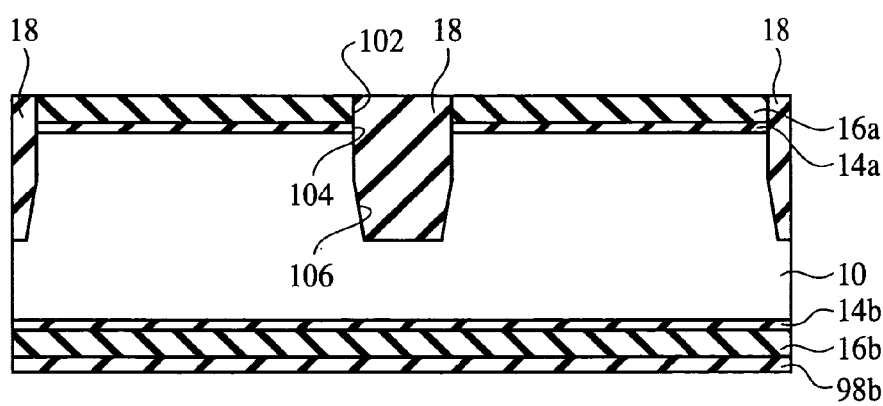

Then, the silicon oxide film 108 is polished by, e.g., CMP until the surface of the silicon nitride film 16a is exposed to thereby remove the silicon oxide film 108 on the silicon nitride film 16a. The silicon nitride film 16a functions as a stopper here for the polishing. Thus, the silicon oxide film 108 is buried in the trenches 106 formed in the silicon wafer 10, the openings 104 formed in the silicon oxide film 14a and the openings 102 formed in the silicon nitride film 16a. Thus, the device isolation films 18 of the silicon oxide film 108 are formed (FIG. 7B).

After the trenches 106 has been formed in the silicon wafer 10 and before the silicon oxide film 108 is buried in the trenches 106, a silicon oxide film of, e.g., a 1-5 nm-thickness may be formed on the inside surface of the trenches 106, and then, a lining silicon nitride film of, e.g., a 5-20 nm-thickness may be formed on the inside surface of the trenches 106 and the surface of the silicon nitride film 16a.

Figure 7C:
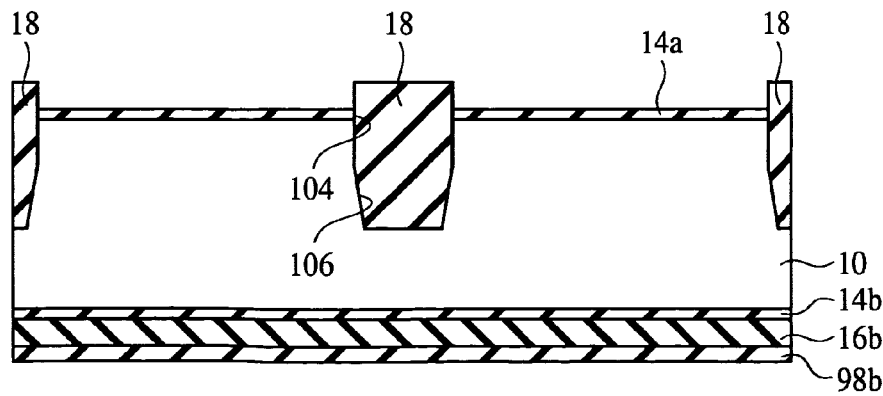

Then, the silicon nitride film 16a on the upper surface of the silicon wafer 10 is removed by wet etching using, e.g., a heated phosphoric acid solution. At this time, the silicon nitride film 16b covered by the silicon oxide film 98b is protected from the etching. Thus, the silicon nitride film 16b remains on the back surface of the silicon wafer 10 (FIG. 7C).

Figure 8A:
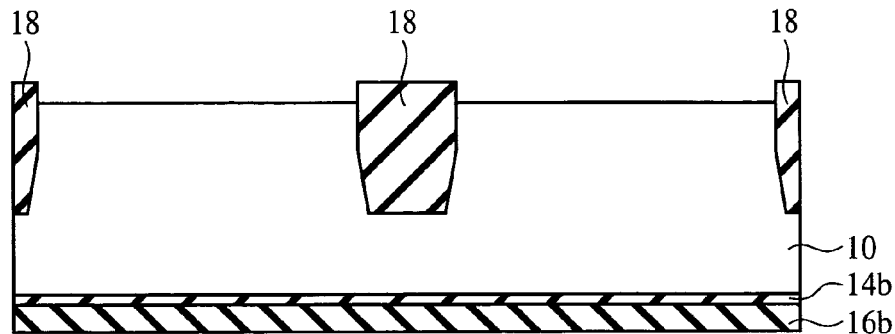
FIGS. 8A-8C are sectional views of the semiconductor device according to the first embodiment of the present invention in the steps of the method for fabricating the same, which illustrate the method (Part 4).

Then, the silicon oxide film 14a exposed on the upper surface of the silicon wafer 10 and the silicon oxide film 98b on the back surface of the silicon wafer 10 are respectively removed by wet etching using, e.g., hydrofluoric acid (FIG. 8A).

Figure 8B:
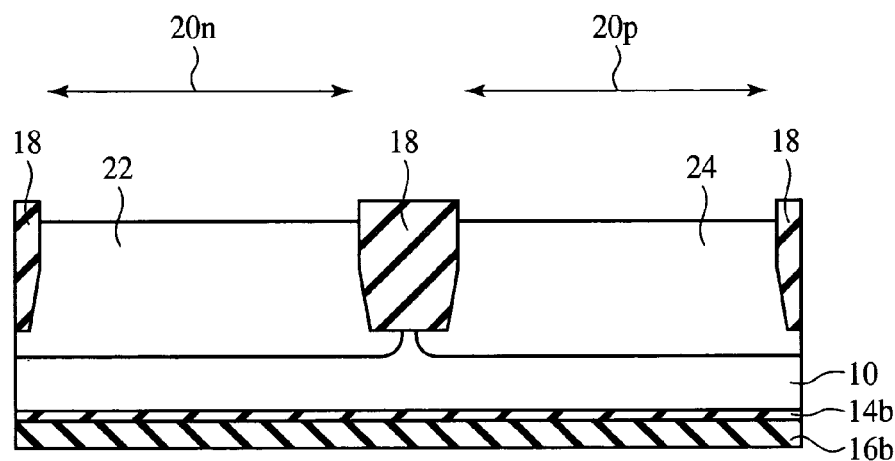

Next, by, e.g., ion implantation, the p type well 22 is formed in the NMOS transistor region 20n, and the n type well 24 is formed in the PMOS transistor region 20p (FIG. 8B).

Figure 8C:
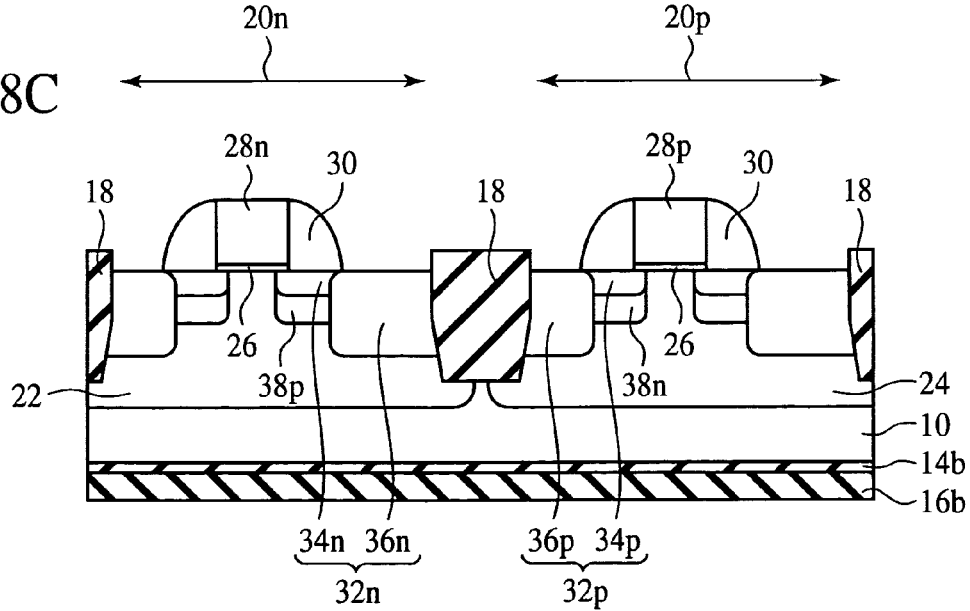

Next, using the same way as in the usual MOS transistor fabrication method, on the side of the upper surface of the silicon wafer 10, the NMOS transistor including the gate electrode 28n and the source/drain diffused layers 22n is formed in the NMOS transistor region 20, and the PMOS transistor including the gate electrode 28p and the source/drain diffused layers 32p is formed in the PMOS transistor region 24 (FIG. 8C).

Figure 9A:
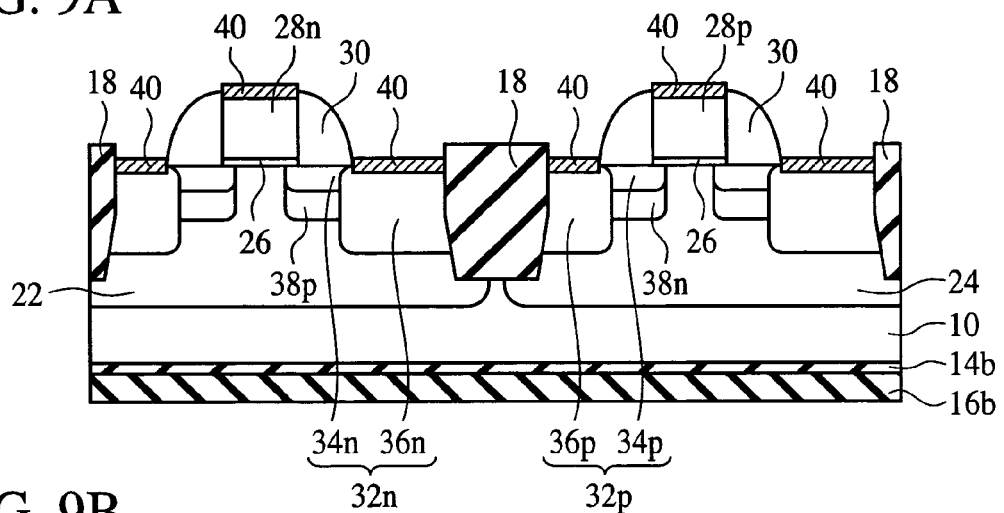
FIGS. 9A-9C are sectional views of the semiconductor device according to the first embodiment of the present invention in the steps of the method for fabricating the same, which illustrate the method (Part 5).

Then, using the salicide process, the metal silicide films 40 are formed respectively on the gate electrodes 28n, 28p and the source/drain diffused layers 32n, 32p (FIG. 9A).

Figure 9B:
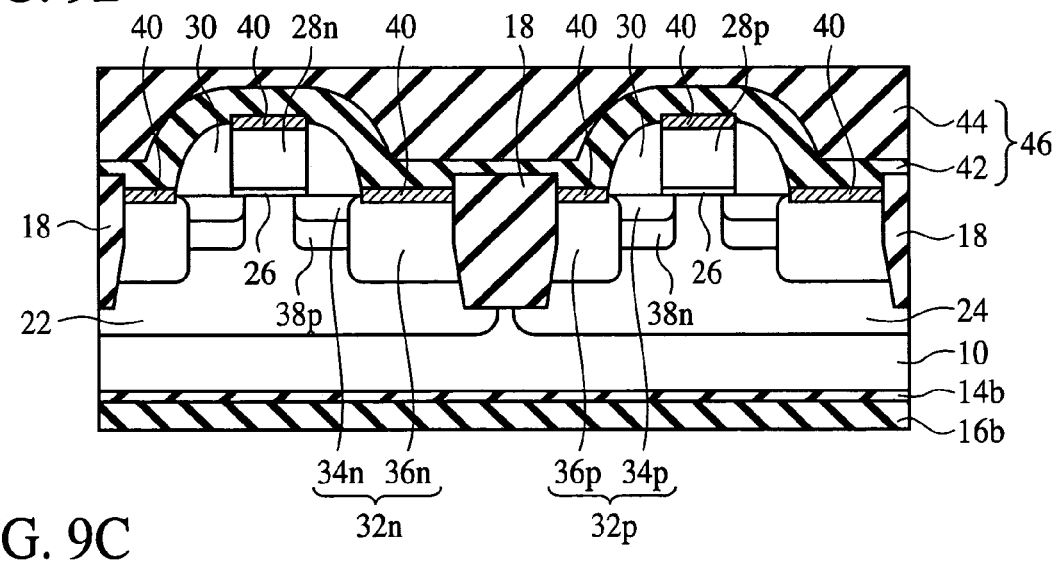

Next, on the upper surface of the silicon wafer with the NMOS transistor and the PMOS transistor formed on, the silicon nitride film 42 of, e.g., a 30-100 nm-thickness is formed by, e.g., CVD. Then, the silicon oxide film 44 of, e.g., a 600-800 nm-thickness is formed on the silicon nitride film 42. Then, the surface of the silicon oxide film 44 is polished by, e.g., CMP to flatten the surface of the silicon oxide film 44. Thus, the inter-layer insulation film 46 formed of the silicon nitride film 42 and the silicon oxide film 44 laid the latter on the former is formed (FIG. 9B).

Figure 9C:
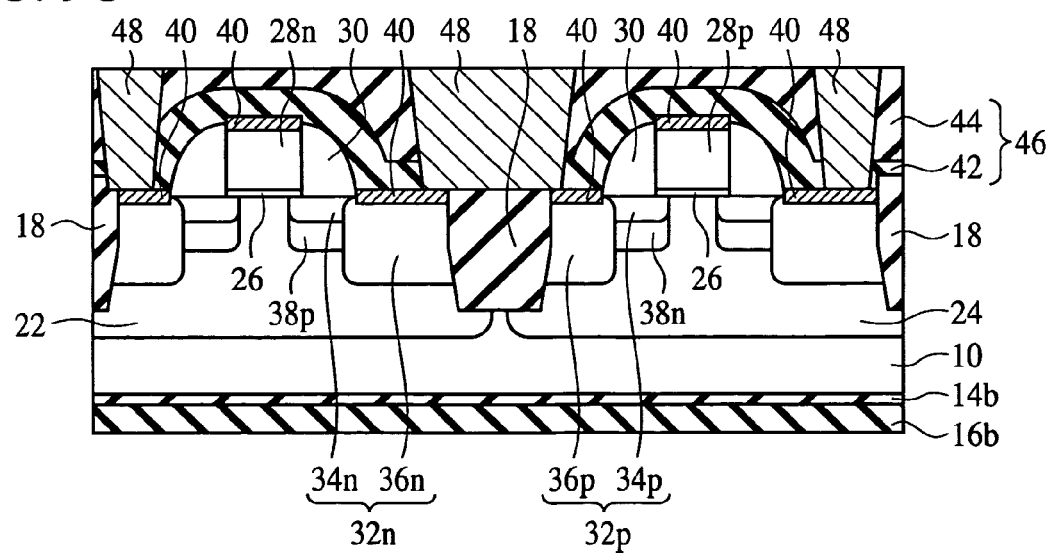

Then, contact holes are formed by photolithography and dry etching in the inter-layer insulation film 46 down to the metal silicide films 40 formed on the source/drain diffused layers 32n, 32p. Next, a metal film is formed by, e.g., CVD on the inter-layer insulation film 46 with the contact holes formed in. Next, the metal film is polished by, e.g, CMP until the surface of the silicon oxide film 44 is exposed. Thus, the contact plugs 48 of the metal film buried in the contact holes are formed (FIG. 9C).

Hereafter, on the inter-layer insulation film 46 with the contact plugs 48 buried in, the multilayer interconnection 12 including, e.g., 11 interconnection layers buried in the inter-layer insulation films illustrated in FIG. 1 is formed by the usual multilayer interconnection forming method using single damascening, dual damascening, etc. The silicon nitride film to be formed on the upper surface of the silion wafer 10 as the inter-layer insulation film is formed at, e.g., a 500-600° C. film forming temperature and in, e.g., a 30-100 nm-thickness. The silicon nitride film formed as the inter-layer insulation film has, e.g., a 1-2 GPa tensile stress.

Thus, the semiconductor device according to the present embodiment is fabricated.

As described above, according to the present embodiment, the silicon nitride film 16b, which is an insulation film having tensile stress, is formed on the back surface of the silicon wafer 10 on the upper surface of which insulation films having tensile stresses are formed, whereby the warpage of the silicon wafer 10 can be depressed. The silicon nitride film 16b is formed concurrently with forming the silicon nitride film 16a which is used as the mask for etching and the stopper for polishing in forming the device isolation film 18, whereby the warpage of the silicon wafer 10 can be depressed without adding to the step number of the method for fabricating the semiconductor device. The warpage of the silicon wafer 10 is thus depressed, whereby the generation of defective suction in the transfer system for semiconductor substrates can be prevented.

In the present embodiment, the silicon wafer 10 has a 200 mm diameter. However, according to the present embodiment, the warpage of silicon wafers of large diameters of, e.g., 200 nm or more can be depressed, and the generation of defective suction in the transfer system for semiconductor substrates can be prevented.

A Second Embodiment

The semiconductor device and the method for fabricating the same according to a second embodiment of the present invention will be explained with reference to FIGS. 10A-10C, 11A-11C, 12A-12C and 13A-13C. FIG. 10A-10C, 11A-11C, 12A-12C and 13A-13C are sectional views of the semiconductor device according to the present embodiment in the steps of the method for fabricating the same, which illustrate the method. The same members of the present embodiment as those of the semiconductor device and the method for fabricating the same according to the first embodiment are represented by the same reference numbers not to repeat or to simplify their explanation.

The basic structure of the semiconductor device according to the present embodiment is the same as that of the semiconductor device according to the first embodiment. The semiconductor device according to the present embodiment is different from the semiconductor device according to the first embodiment in the fabrication method. The method for fabricating the semiconductor device according to the present embodiment will be explained with reference to FIGS. 10A-10C, 11A-11C, 12A-12C and 13A-13C.

Figure 10A:
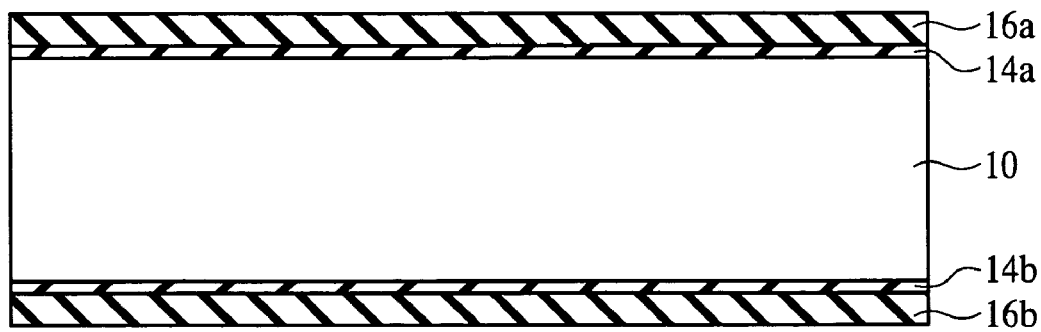
FIGS. 10A-10C are sectional views of the semiconductor device according to a second embodiment of the present invention in the steps of the method for fabricating the same, which illustrate the method (Part 1).

First, silicon oxide films 14a, 14b and silicon nitride films 16a, 16b are formed on the upper surface and the back surface of a silicon wafer 10 in the same way as in the method for fabricating the semiconductor device according to the first embodiment (FIG. 10A).

Figure 10B:
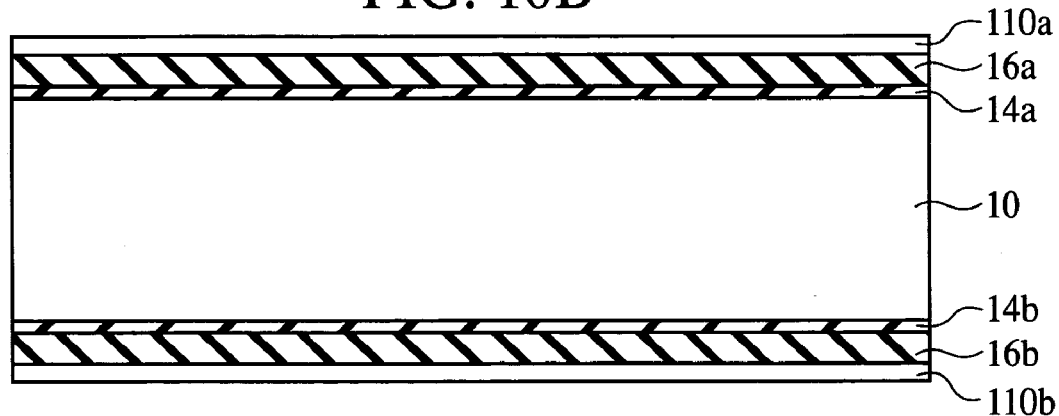

Then, polycrystal silicon film 110a, 110b of, e.g., a 100-200 nm-thickness are formed by thermal CVD using, e.g., a vertical furnace respectively on the silicon nitride films 16a, 16b formed on the upper surface and the back surface of the silicon wafer 10 (FIG. 10B). As conditions for forming the polycrystal silicon films 110a, 10b, the raw material gas is, e.g., SiH$_4$, and the film forming temperature is, e.g., 600-700° C. The polycrystal silicon film 110b functions as a protection film for protecting the silicon nitride film 16b so that the silicon nitride film 16b is not removed by the etching for removing the silicon nitride film 16a.

Figure 10C:
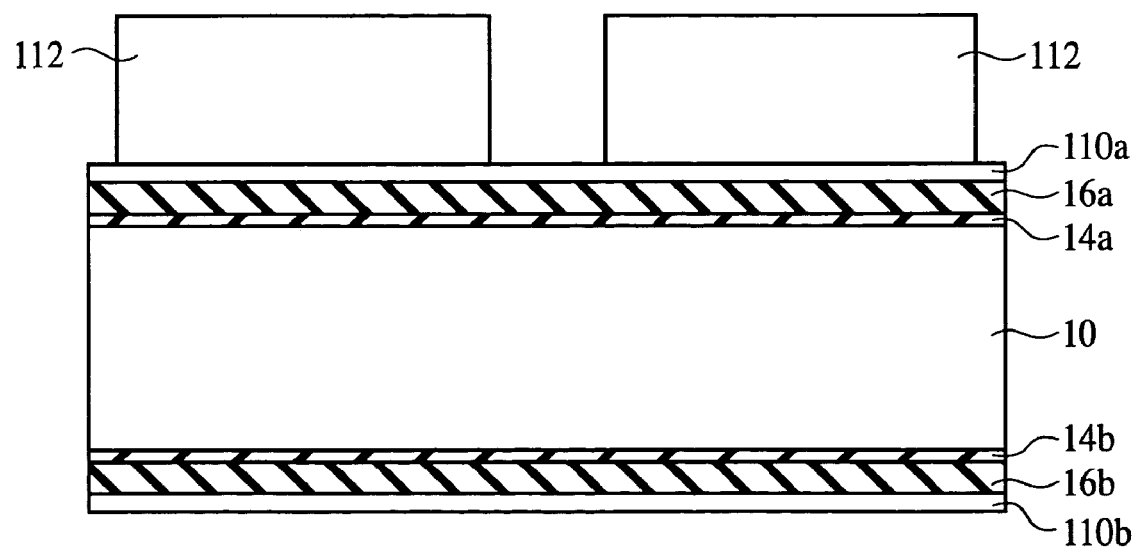

Next, a photoresist film 112 for exposing regions for device isolation films 18 to be formed in and covering the rest region is formed by photolithography on the polycrsytal silicon film 110a on the upper surface of the silicon wafer 10 (FIG. 10C).

Figure 11A:
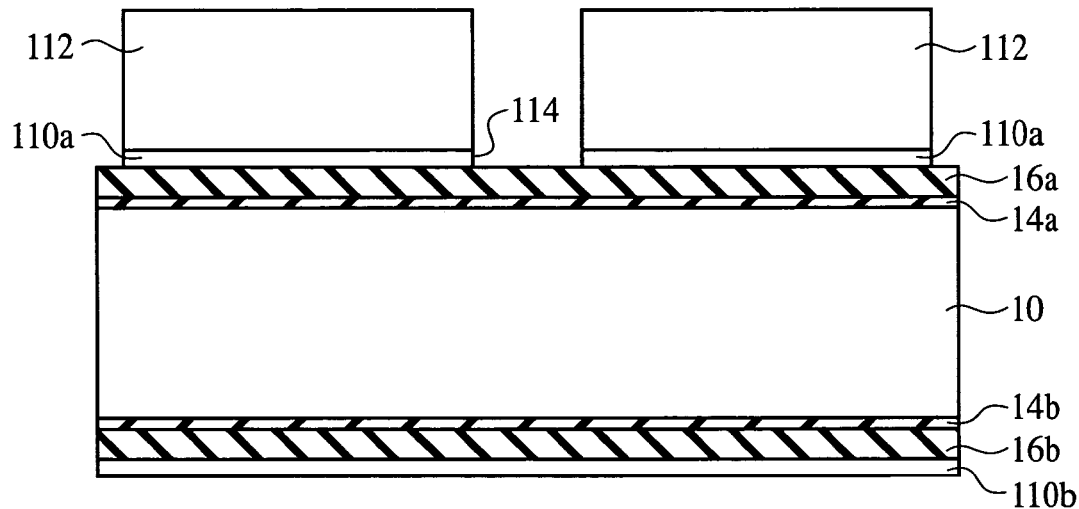
FIGS. 11A-11C are sectional views of the semiconductor device according to the second embodiment of the present invention in the steps of the method for fabricating the same, which illustrate the method (Part 2).
Figure 11B:
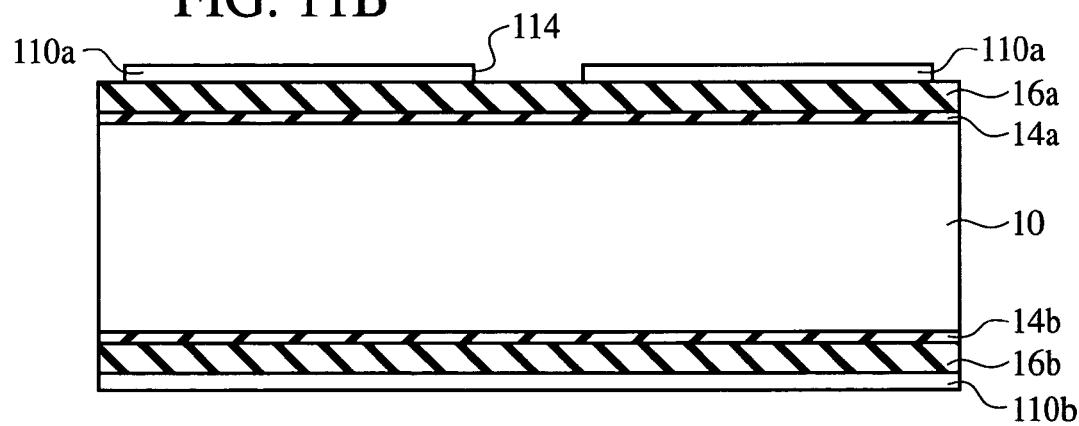

Then, with the photoresist film 112 as a mask, the polycrystal silicon film 110a is etched. Thus, openings 114 are formed in the polycrystal silicon film 110a (FIG. After the openings 114 have been formed in the polycrystal silicon film 11a, the photoresisit film 112 is removed by, e.g., ashing (FIG. 11B).

Figure 11C:
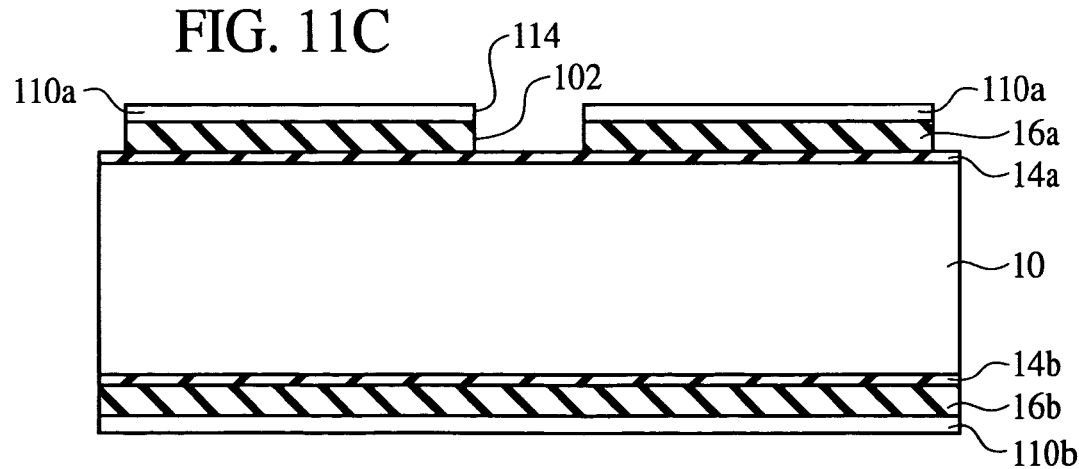

Then, with the polycrystal silicon film 11a as a mask, the silicon nitride film 16a is etched from the side of the upper surface of the silicon wafer 10 to form openings 102 in the silicon nitride film 16a (FIG. 11C).

Figure 12A:
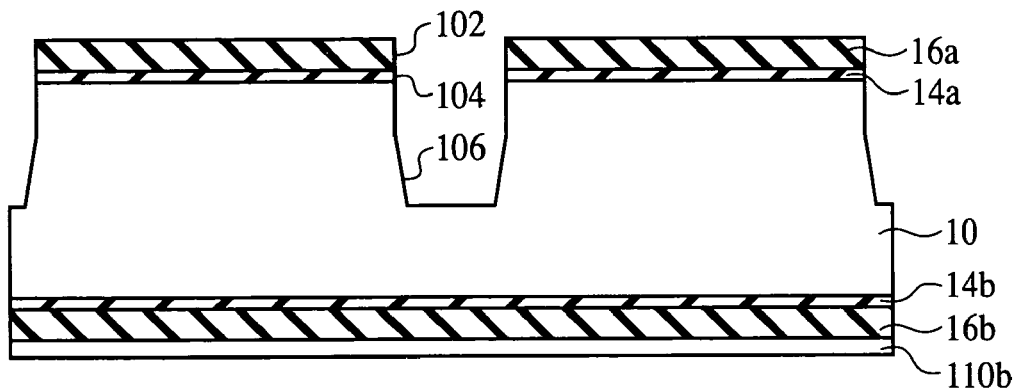
FIGS. 12A-12C are sectional views of the semiconductor device according to the second embodiment of the present invention in the steps of the method for fabricating the same, which illustrate the method (Part 3).

Then, with the polycrystal silicon film 11a and the silicon nitride film 16a as a mask, the silicon oxide film 14a and the silicon wafer 10 are etched from the upper surface of the silicon wafer 10. Thus, openings 104 are formed in the silicon oxide film 14a while a trenches 106 of, e.g., a 0.3-0.5 µm-depth are formed in the upper surface of the silicon wafer 10. The polycrystal silicon film 110a itself used as the mask is etched here and is removed when the trenches 106 are formed. The silicon nitride film 16a, however, remains (FIG. 12A).

Figure 12B:
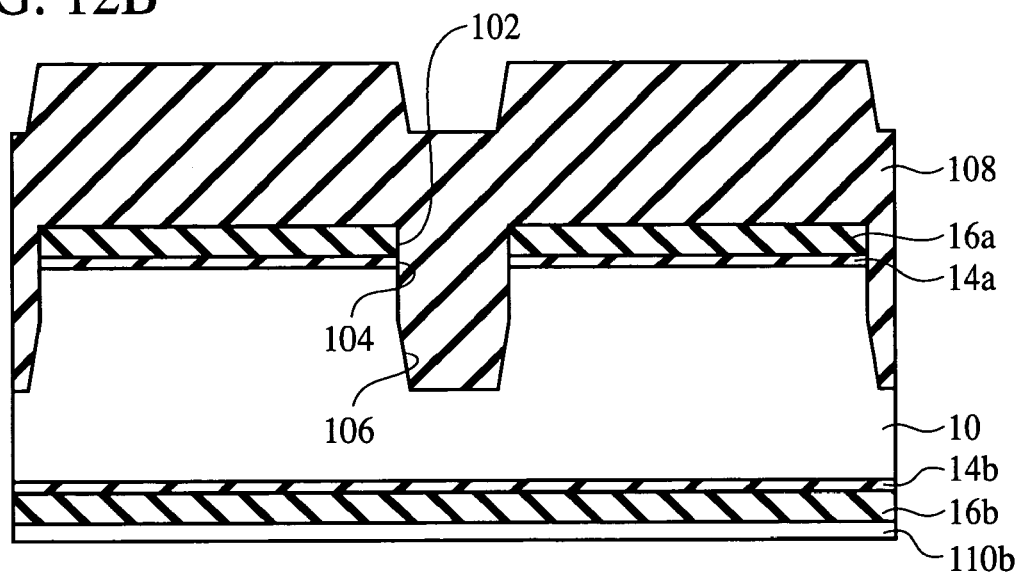

Next, the silicon oxide film 108 of, e.g., a 400-600 nm-thickness is formed on the entire upper surface of the silicon wafer 10 by, e.g., CVD (FIG. 12B).

Figure 12C:
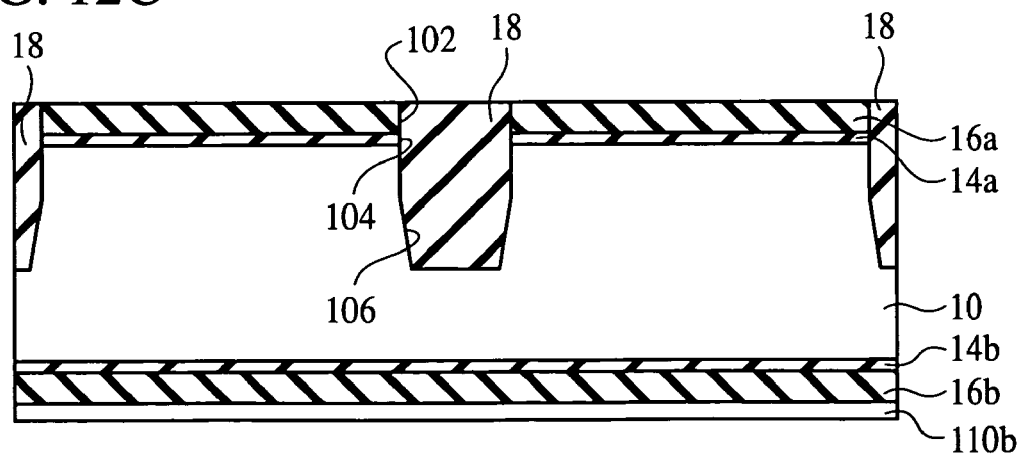

Then, the silicon oxide film 108 is polished by, e.g., CMP until the upper surface of the silicon nitride film 16a is exposed to remove the silicon oxide film 108 on the silicon nitride film 16a. The silicon nitride film 16a functions here as a stopper for the polishing. Thus, the silicon oxide film 108 is buried in the trenches 106 formed in the silicon wafer 10, the openings 104 formed in the silicon oxide film 14a and the openings 102 formed in the silicon nitride film 16a, and the device isolation films 18 of the silicon oxide film 108 are formed (FIG. 12C).

After the trenches 106 have been formed in the silicon wafer 10 and before the silicon oxide film 108 is buried in the trenches 106, a silicon oxide film of, e.g., a 1-5 nm-thickness may be formed on the inside surface of the trenches 106, and then, a lining silicon nitride film of, e.g., a 5-20 nm-thickness may be formed on the inside surface of the trenches 106 and the surface of the silicon nitride film 16a.

Figure 13A:
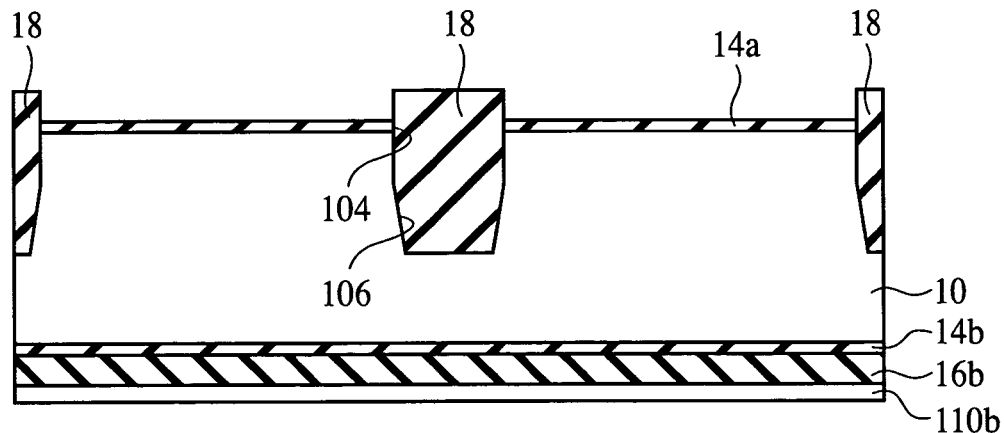
FIGS. 13A-13C are sectional views of the semiconductor device according to the second embodiment of the present invention in the steps of the method for fabricating the same, which illustrate the method (Part 5).

Then, the silicon nitride film 16a on the upper surface of the silicon wafer 10 is removed by wet etching using, e.g., a heated phosphoric acid solution (FIG. 13A). At this time, the silicon nitride film 16b covered by the polycrystal silicion film 110b is protected from the etching. Thus, the silicon nitride film 16b remains on the back surface of the silicon wafer 10.

Figure 13B:
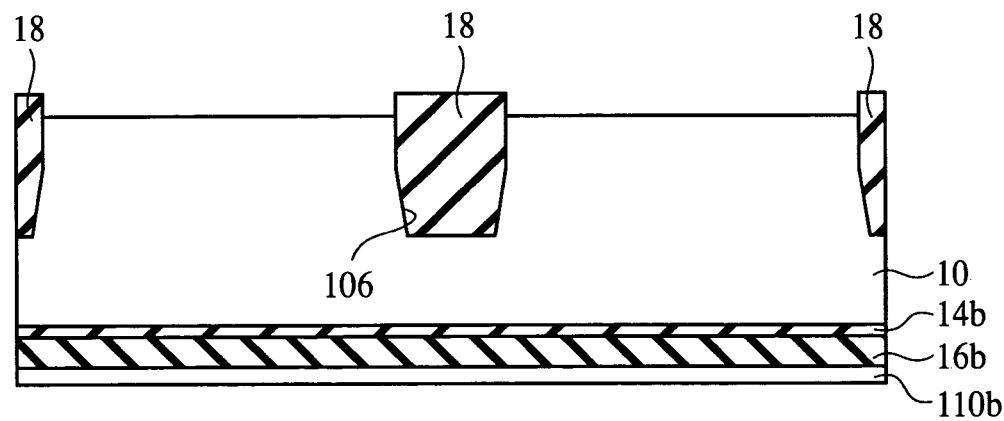

Then, the silicon oxide film 14a exposed on the upper surface of the silicon wafer 10 is removed by wet etching using, e.g., hydrofluoric acid (FIG. 13B).

Figure 13C:
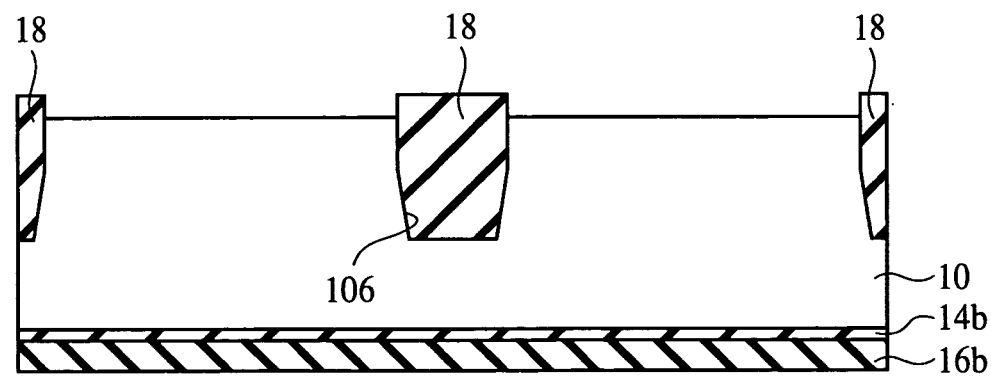
Figure 14A:
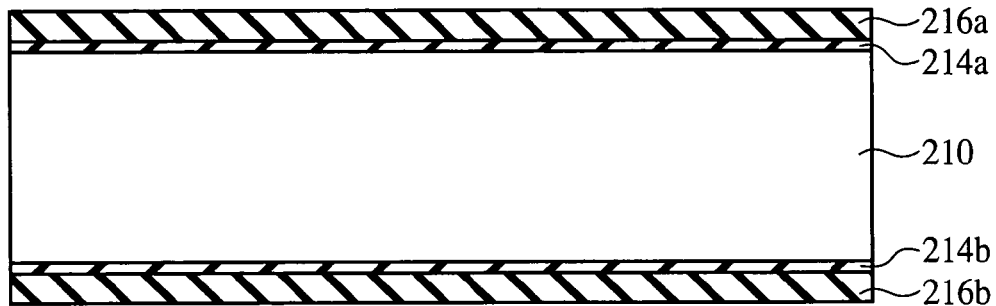
FIGS. 14A-14C are sectional views of the conventional semiconductor device having the multilayer structure in the steps of the method for fabricating the same, which illustrate the method (Part 1).
Figure 14B:
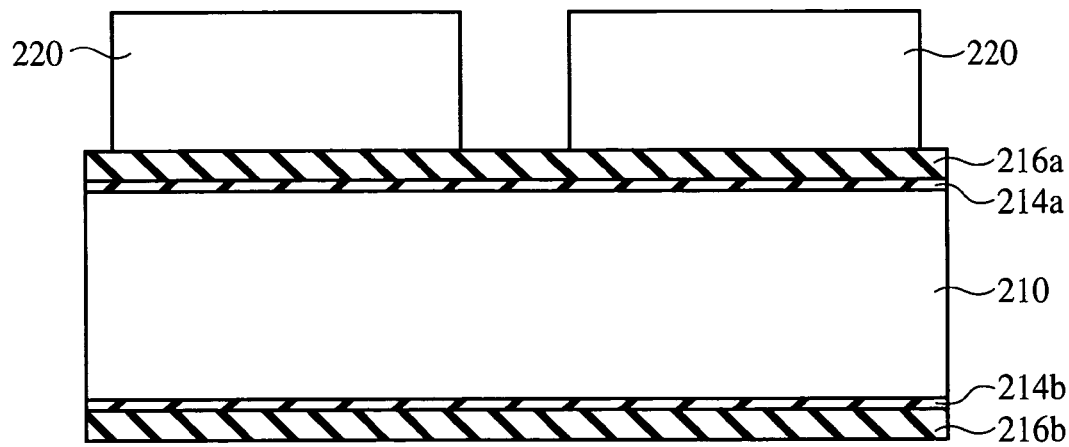
Figure 14C:
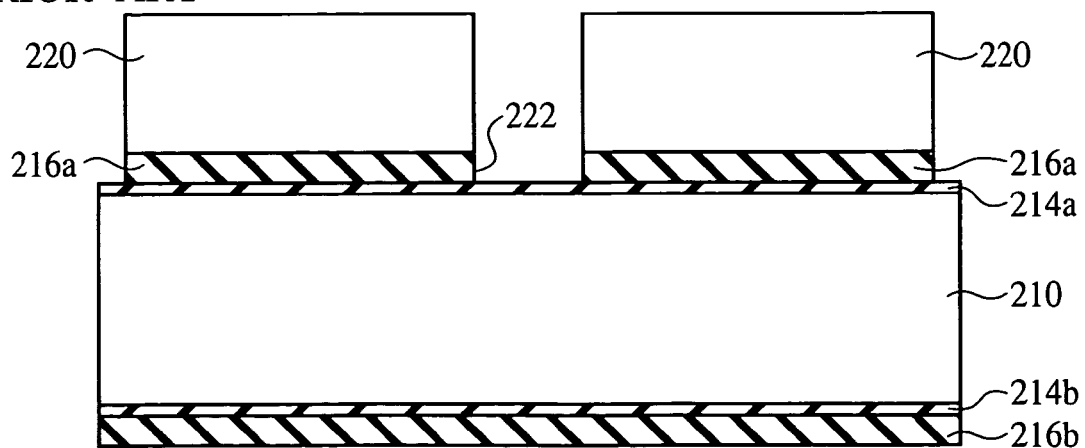
Figure 15A:
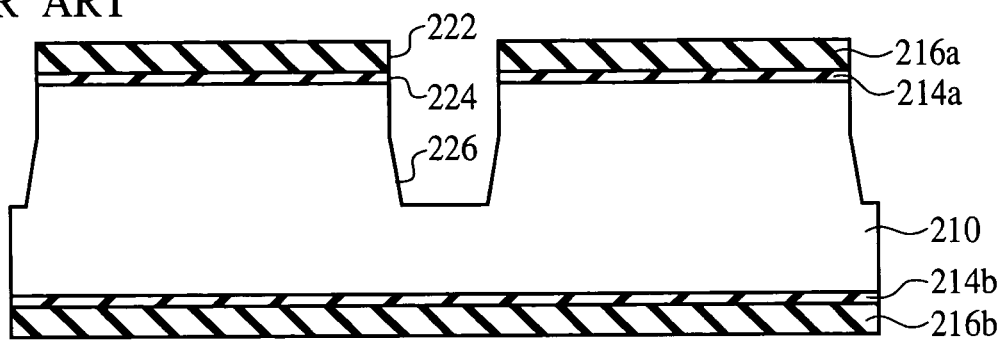
FIGS. 15A-15C are sectional views of the conventional semiconductor device having the multilayer structure in the steps of the method for fabricating the same, which illustrate the method (Part 2).
Figure 15B:
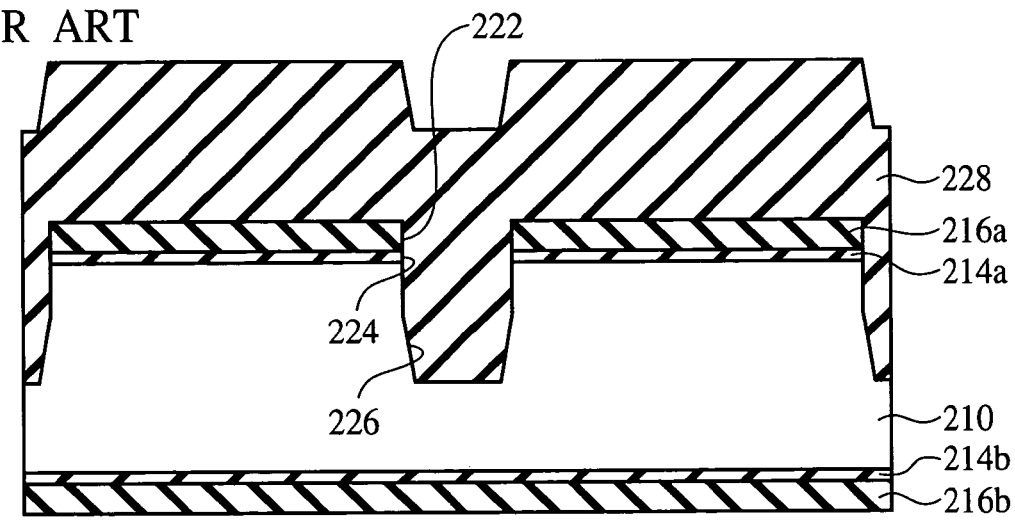
Figure 15C:
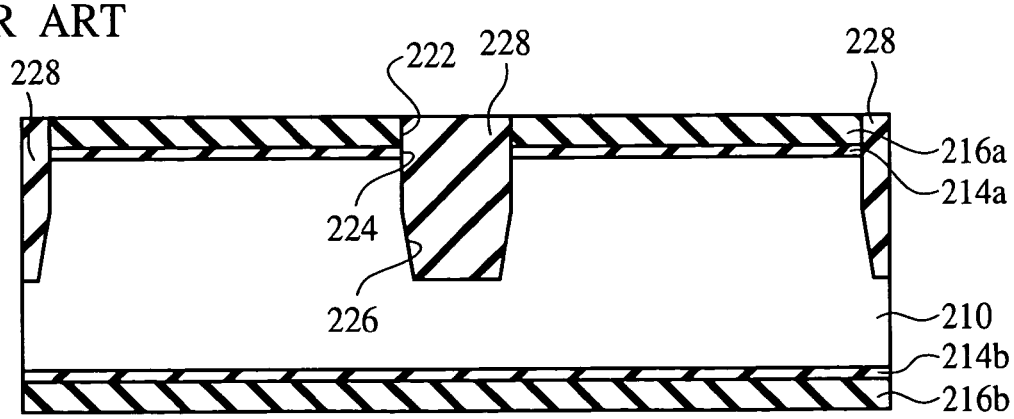
Figure 16A:
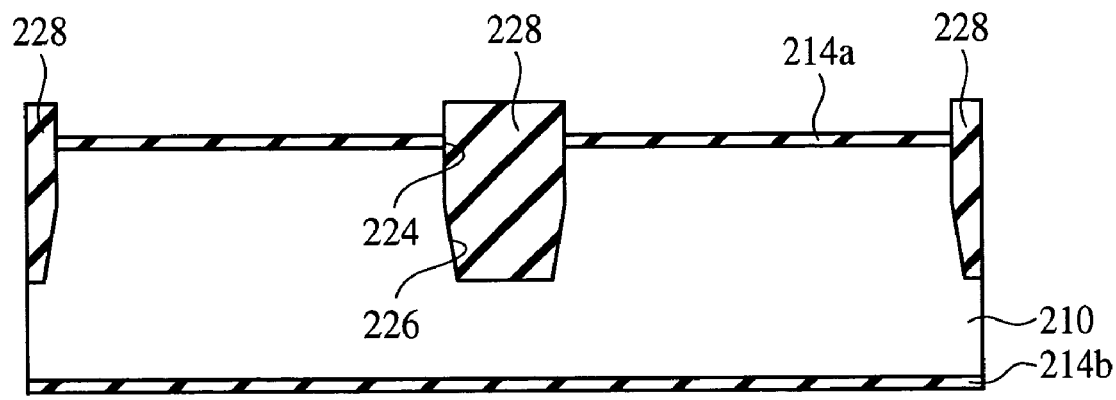
FIGS. 16A and 16B are sectional views of the conventional semiconductor device having the multilayer structure in the steps of the method for fabricating the same, which illustrate the method (Part 3).
Figure 16B:
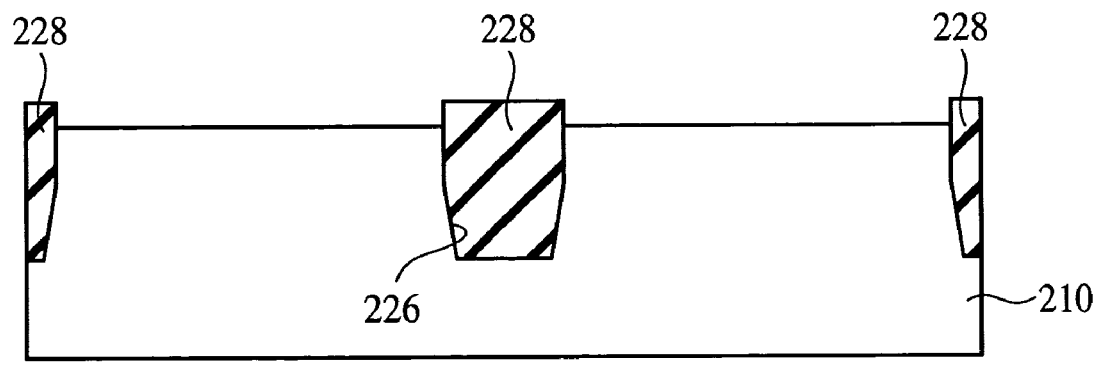

Next, the polycrystal silicon film 110b on the back surface of the silicon wafer 10 is removed by wet etching using, e.g., fluoro-nitric acid (FIG. 13C). The polycrystal silicon film 110b on the back surface of the silicon wafer 10 can be selectively removed by using a single wafer spin cleaner.

The following steps are the same as those of the method for fabricating a semiconductor device according to the first embodiment illustrated in FIGS. 8B-8C and 9A-9C, and their explanation will be omitted.

As described above, according to the present embodiment, the silicon nitride film 16b, which is an insulation film having tensile stress, is formed on the back surface of the silicon wafer on the upper surface of which insulation films having tensile stress are to be formed, whereby the warpage of the silicon wafer 10 can be depressed. The silicon nitride film 16b is formed concurrently with the silicon nitride film 16a used as the mask for etching and the stopper for polishing for forming the device isolation films 18, whereby the warpage of the silicon wafer 10 can be depressed without adding to the step number of the method for fabricating the semiconductor device. The warpage of the silicon wafer 10 is thus depressed, whereby the generation of the defective suction in the transfer system for semiconductor wafers can be prevented.

Modified Embodiments

The present invention is not limited to the above-described embodiments and can cover other various modifications.

For example, in the above-described embodiments, NMOS transistors and PMOS transistors are formed, but the semiconductor devices to be formed on the silicon wafer 10 are not limited to NMOS transistors and PMOS transistors.

In the above-described embodiments, the multilayer interconnection 12 including 11 interconnection layers is formed on the upper surface of the silicon wafer 10, but the interconnection layer number of the multilayer interconnection 12 is not essentially limited to 11 layers. According to the present invention, the warpage of the silicon wafer 10 can be effectively depressed even in a case that a multilayer interconnection of a large interconnection layer number, such as 10 or more interconnection layers is formed on the upper surface of the silicon wafer 10.

In the above-described embodiments, the silicon nitride film 16b is formed on the back surface of the silicon wafer 10. However, an insulation film having tensile stress may be formed on the back surface of the silicon wafer 10. As the insulation film having tensile stress other than silicon nitride film, SOG (Spin On Glass) film or others, for example, can be formed.

In the above-described embodiments, as the protection film for covering the silicon nitride film 16b so that the silicon nitride film 16b, which is on the back surface of the silicon wafer 10, is not etched off, the silicon oxide film 98b or the polycrystal silicon film 110b is formed. However, the protection film for covering the silicon nitride film 16b is not limited to them. The protection film for covering the silicon nitride film 16b may be different from silicon nitride film in the etching characteristics for a prescribed etching solution, such as heated phosphoric acid solution or others. As the protection films, other than the silicon oxide film 98b and the polycrystal silicon film 110b, SiON film, SiC film, SiOC film, etc., for example, can be formed.

In the above-described embodiments, the silicon nitride film 16b, which is an insulation film having tensile stress, is formed on the back surface pf the silicon wafer 10 on the upper surface of which insulation films having tensile stresses are to be formed. The present invention is applicable widely to a case that insulation films formed on the upper surface of the silicon wafer 10 exert stress to the silicon wafer 10. In such case, an insulation film having a stress which relaxes a stress exerted to the silicon wafer 10 by insulation films formed on the upper surface of the silicon wafer 10 may be formed on the back surface of the silicon wafer 10.

In the above-described embodiments, the silicon wafer 10 is used. However, the present invention is applicable not only to the silicon wafer 10, but also to various semiconductor wafers. The present invention is applicable not only to wafers, but also to semiconductor substrates in various shapes.

What is claimed is:

1. A method for fabricating a semiconductor device comprising the steps of:
    forming a gate electrode on one surface of a semiconductor substrate with a gate insulation film formed therebetween;
    forming a source/drain region in the semiconductor substrate on both sides of the gate electrode;
    forming a contact plug electrically connected to the semiconductor substrate;
    forming a first insulation film on said one surface of the semiconductor substrate, the first insulation film including multiple insulation films; and
    forming a multilayer interconnection buried in the first insulation film, the multilayer interconnection including multiple interconnection layers, said multiple interconnection layers being buried in said multiple insulation films, respectively;
    the method further comprising before the step of forming the first insulation film, the step of forming a second insulation film on the other surface of the substrate, having a stress relaxing a stress exerted by the first insulation film to the substrate, wherein in the step of forming the second insulation film, a third insulation film is formed on said one surface of the substrate, the third insulation film being used as a mask for etching the substrate.

2. A method for fabricating a semiconductor device according to claim 1, wherein in the step of forming the second insulation film, the second insulation film having a stress equal to that of the first insulation film is formed.

3. A method for fabricating a semiconductor device according to claim 1, wherein in the step of forming the second insulation film, the second insulation film having a tensile stress is formed.

4. A method for fabricating a semiconductor device according to claim 1, wherein the second insulation film is a silicon nitride film.

5. A method for fabricating a semiconductor device comprising the steps of:
    forming a gate electrode on one surface of a semiconductor substrate with a gate insulation film formed therebetween;
    forming a source/drain region in the semiconductor substrate on both sides of the gate electrode;
    forming a contact plug electrically connected to the semiconductor substrate;
    forming a first insulation film on said one surface of the semiconductor substrate; and
    forming a multilayer interconnection buried in the first insulation film;
    the method further comprising before the step of forming the first insulation film; the step of forming a second insulation film on the other surface of the substrate, having a stress relaxing a stress exerted by the first insulation film to the substrate, wherein in the step of forming the second insulation film, a third insulation film is formed on said one surface of the substrate,
    the method further comprising the steps of:
    forming an opening in the third insulation film;
    etching the substrate with the third insulation film as a mask to form a trench in said one surface of the substrate; and
    forming a device isolation film buried in the trench.

6. A method for fabricating a semiconductor device according to claim 5, wherein the step of forming the device isolation film includes the steps of: forming a fourth insulation film on said one surface of the substrate with the trench formed in and on the third insulation film; and polishing the fourth insulation film with the third insulation film as a stopper to form the device isolation film of the fourth insulation film buried in the trench.

7. A method for fabricating a semiconductor device according to claim 5, wherein in the step of forming the second insulation film, the second insulation film is formed on said other surface of the substrate and also on said one surface of the substrate by CVD using a vertical furnace.

8. A method for fabricating a semiconductor device according to claim 5, wherein the second insulation film and the third insulation film are a silicon nitride film.

9. A method for fabricating a semiconductor device according to claim 5, the method further comprising after the step of forming the second insulation film and before the step of forming the first insulation film; the step of:
    forming a mask film on the second insulation film; and
    removing the third insulation film, protecting the second insulation film by the mask film.

10. A method for fabricating a semiconductor device according to claim 9, wherein in the step of forming the mask film, the mask film is formed on the second insulation film and on the third insulation film, and then the mask film on the third insulation film is removed.

11. A method for fabricating a semiconductor device according to claim 10, wherein in the step of forming the mask film, the mask film is formed on the second insulation film and also on the third insulation film by CVD using a vertical furnace.

12. A method for fabricating a semiconductor device according to claim 9, further comprising after the step of removing the third insulation film, the step of removing the mask film.

13. A method for fabricating a semiconductor device according to claim 9, wherein the mask film is a silicon oxide film or a polycrystal silicon film.

14. A method for fabricating a semiconductor device comprising the steps of:
    forming a gate electrode on one surface of a semiconductor substrate with a gate insulation film formed therebetween;
    forming a source/drain region in the semiconductor substrate on both sides of the gate electrode;
    forming a contact plug electrically connected to the semiconductor substrate;
    forming a first insulation film on said one surface of the semiconductor substrate; and
    forming a multilayer interconnection buried in the first insulation film;
    the method further comprising before the step of forming the first insulation film, the step of forming a second insulation film on the other surface of the substrate, having a stress relaxing a stress exerted by the first insulation film to the substrate, wherein in the step of forming the second insulation film, a third insulation film is formed on said one surface of the substrate, the method further comprising after the step of forming the second insulation film and before the step of forming the first insulation film, the steps of:

forming a mask film on the second insulation film and the mask film also on the third insulation film;

forming a first opening in the mask film on the third insulation film;

etching the third insulation film with the mask film on the third insulation film as a mask to form a second opening in the third insulation film;

etching the substrate with the mask film on the third insulation film and the third insulation film as a mask to form a trench in said one surface of the substrate;

forming a device isolation film buried in the trench; and removing the third insulation film, protecting the second insulation film by the mask film on the second insulation film.

15. A method for fabricating a semiconductor device according to claim 14, wherein in the step of forming the mask film, the mask film is formed on the second insulation film and also on the third insulation film by CVD using a vertical furnace.

16. A method for fabricating a semiconductor device according to claim 14, wherein the step of forming the device isolation film includes the steps of: forming a fourth insulation film on said one surface of the substrate with the trench formed in and on the third insulation film; and polishing the fourth insulation film with the third insulation film as a stopper to form the device isolation film of the fourth insulation film buried in the trench.

17. A method for fabricating a semiconductor device according to claim 14, wherein in the step of forming the second insulation film, the second insulation film is formed on said other surface of the substrate and also on said one surface of the substrate by CVD using a vertical furnace.

18. A method for fabricating a semiconductor device according to claim 14, further comprising after the step of removing the third insulation film, the step of removing the mask film on the second insulation film.

19. A method for fabricating a semiconductor device according to claim 14, wherein the second insulation film and the third insulation film are a silicon nitride film.

20. A method for fabricating a semiconductor device according to claim 14, wherein the mask film is a silicon oxide film or a polycrystal silicon film.

* * * * *